US007838972B2

(12) United States Patent
Hojo

(10) Patent No.: US 7,838,972 B2
(45) Date of Patent: Nov. 23, 2010

(54) LEAD FRAME AND METHOD OF MANUFACTURING THE SAME, AND SEMICONDUCTOR DEVICE

(75) Inventor: Akinobu Hojo, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 94 days.

(21) Appl. No.: 11/964,423

(22) Filed: Dec. 26, 2007

(65) Prior Publication Data

US 2008/0157309 A1 Jul. 3, 2008

(30) Foreign Application Priority Data

Dec. 27, 2006 (JP) ............... 2006-352872

(51) Int. Cl.
*H01L 23/495* (2006.01)
(52) U.S. Cl. ............... 257/676; 257/673; 257/E23.053; 257/E23.054
(58) Field of Classification Search ................. 257/676, 257/673
See application file for complete search history.

(56) References Cited

U.S. PATENT DOCUMENTS

| | | | | |
|---|---|---|---|---|
| 4,922,324 A * | 5/1990 | Sudo | .......................... | 257/700 |
| 5,326,990 A * | 7/1994 | Mita et al. | ................... | 257/672 |
| 5,599,747 A * | 2/1997 | Bhatt et al. | ................... | 29/832 |
| 6,238,952 B1 * | 5/2001 | Lin | ............................. | 438/110 |
| 6,301,122 B1 * | 10/2001 | Ishikawa et al. | ............ | 361/794 |
| 7,226,811 B1 * | 6/2007 | McLellan et al. | ........... | 438/111 |
| 7,259,044 B2 * | 8/2007 | Kasahara et al. | ............ | 438/123 |
| 2004/0130010 A1 * | 7/2004 | Kuan et al. | .................. | 257/676 |
| 2005/0101055 A1 * | 5/2005 | Kasahara et al. | ........... | 438/106 |
| 2005/0184364 A1 * | 8/2005 | Kim et al. | .................... | 257/666 |
| 2006/0284292 A1 * | 12/2006 | Cheng | ........................ | 257/678 |
| 2007/0099339 A1 * | 5/2007 | Chang | ........................ | 438/106 |
| 2007/0102813 A1 * | 5/2007 | Nakao | ........................ | 257/734 |
| 2007/0105281 A1 * | 5/2007 | Tabira | ........................ | 438/123 |
| 2007/0181983 A1 * | 8/2007 | Takai et al. | ................. | 257/666 |
| 2007/0228541 A1 * | 10/2007 | Lin et al. | ..................... | 257/684 |
| 2008/0087996 A1 * | 4/2008 | Miyaki et al. | ............... | 257/677 |
| 2008/0224290 A1 * | 9/2008 | Abbott | ........................ | 257/676 |

FOREIGN PATENT DOCUMENTS

JP 2002-261187 9/2002

* cited by examiner

*Primary Examiner*—Leonardo Andújar
*Assistant Examiner*—William Harriston
(74) *Attorney, Agent, or Firm*—Rankin, Hill & Clark LLP

(57) ABSTRACT

A lead frame includes a lead frame main body having a plurality of die pad portions each having a chip mounting surface on which a semiconductor chip is mounted, a plurality of lead portions provided to surround the plurality of die pad portions respectively, and a frame portion for supporting the plurality of die pad portions and the plurality of lead portions, an adhesive film pasted on a lower surface of the lead frame main body by pressing, and a first metal film provided on surfaces of the plurality of lead portions and connected electrically to the semiconductor chip respectively, wherein second metal films whose thickness is substantially equal to a thickness of the first metal film are provided to the chip mounting surface of the plurality of die pad portions respectively.

5 Claims, 41 Drawing Sheets

LEAD FRAME AND METHOD OF MANUFACTURING THE SAME, AND SEMICONDUCTOR DEVICE

This application claims priority from Japanese Patent Application No. 2006-352872, filed Dec. 27, 2006, in the Japanese Patent Office. The Japanese Patent Application No. 2006-352872 is incorporated by reference in its entirety.

TECHNICAL FIELD

The present disclosure relates to a lead frame and a method of manufacturing the same and a semiconductor device. More particularly, the present disclosure relates to a lead frame having an adhesive film to prevent such a situation that a sealing resin goes round to the lower surface side of a lead frame main body and a method of manufacturing the same, and a semiconductor device manufactured by using the lead frame.

RELATED ART

As the semiconductor device that can be miniaturized in the related art, there is the semiconductor device called QFN (Quad Flat Non-leaded Package), for example. The QFN is constructed such that only the upper surface (surface of the lead frame main body on which the semiconductor chip is arranged) side of the lead frame main body is sealed with a sealing resin and also the lower surface side of the lead frame main body is used as the external connection terminal (see FIG. 1).

FIG. 1 is a sectional view of a semiconductor device in the related art.

By reference to FIG. 1, a semiconductor device 200 in the related art has a lead frame main body 201, metal films 202, a semiconductor chip 203, and a sealing resin 204.

The lead frame main body 201 has a die pad portion 210, and lead portions 211. The die pad portion 210 has a chip mounting surface 210A on which the semiconductor chip 203 is mounted.

FIG. 2 is a plan view of the semiconductor device shown in FIG. 1. In FIG. 2, for convenience of explanation, illustration of the sealing resin 204 arrange over an upper surface of the lead frame main body 201 is omitted herein.

By reference to FIG. 1 and FIG. 2, a plurality of lead portions 211 are provided to surround the die pad portion 210. The lead portions 211 are arranged away from the die pad portion 210. The lead portion 211 has a function of the external connection terminal of the semiconductor device 200.

The metal films 202 are provided on upper surfaces 211A of a plurality of lead portions 211. Each of the metal films 202 is connected electrically to the semiconductor chip 203 via a metal wire 213. The metal film 202 is used to connect electrically the semiconductor chip 203 to the lead portion 211. As the metal film 202, an Ag film formed by the plating method, for example, can be employed. A thickness of the metal film 202 can be set to 2 μm to 6 μm, for example.

The semiconductor chip 203 is adhered to the chip mounting surface 210A of the die pad portion 210 by an adhesive 215. The semiconductor chip 203 has a plurality of electrode pads 216. The electrode pad 216 is connected to the metal wire 213. The electrode pad 216 is connected electrically to the metal film 202 via the metal wire 213.

The sealing resin 204 is provided to the lead frame main body 201 to cover the semiconductor chip 203 and the metal wires 213. A lower surface 204A of the sealing resin 204 in positions between side surfaces of the die pad portion 210 and side surfaces of plural lead portions 211 is set to constitute the substantially same plane as a lower surface 210B of the die pad portion 210 and lower surfaces 211B of the lead portions 211.

FIG. 3 to FIG. 10 are views showing steps of manufacturing the semiconductor device in the related art, and FIG. 11 is a plan view of the lead frame main body shown in FIG. 3. In FIG. 3 to FIG. 11, the same symbols are affixed to the same configurative portions as the semiconductor device 200 in the related art. Also, in FIG. 3 to FIG. 9, F denotes an area in which a lead frame main body 220 is cut by the dicer after a structural body corresponding to a plurality of semiconductor devices 200 is formed on the lead frame main body 220 (referred to as a "cutting area F" hereinafter), and G denotes an area in which the semiconductor device 200 is formed (referred to as a "semiconductor device forming area G" hereinafter).

By reference to FIG. 3 to FIG. 11, a method of manufacturing the semiconductor device 200 in the related art will be explained hereunder. At first, in steps shown in FIG. 3, the lead frame main body 220 having a plurality of lead frame main bodies 201 and frame portions 221 for supporting a plurality of lead frame main bodies 201 is prepared (see FIG. 11).

Then, in steps shown in FIG. 4, the metal film 202 is formed on the upper surfaces 211A of the lead portions 211. The metal film 202 is formed by the partial plating method using the lead frame main body 220 as a power feeding layer. As the metal film 202, an Ag film, for example, can be used. A thickness of the metal film 202 can be set to 2 μm to 6 μm, for example.

Then, in steps shown in FIG. 5, an adhesive film 228 is put on a flat upper surface 227A of a lower die 227, and then the structural body shown in FIG. 4 is arranged on this adhesive film 228. Then, a flat lower surface 229A of an upper die 229 is pressed against the structural body shown in FIG. 4, and thus the adhesive film 228 is pasted on the lower surface of the lead frame main body 220. This adhesive film 228 is used to prevent such a situation that the sealing resin 204 (see FIG. 1) goes round to the lower surface of the lead frame main body 220 (concretely, the lower surface 210B of the die pad 210, lower surfaces 221B of the lead portions 211, and the lower surfaces 221B of the frame portions 221).

Then, in steps shown in FIG. 6, the lead frame main body 220 to which the adhesive film 228 is adhered is stripped off from the upper die 229 and the lower die 227 shown in FIG. 5. Accordingly, a lead frame 230 equipped with the lead frame main body 220, the metal films 202, and the adhesive film 228 is manufactured.

Then, in steps shown in FIG. 7, the semiconductor chip 203 is adhered to the chip mounting surface 210A of the die pad portion 210 by the adhesive 215. Then, the electrode pads 216 of the semiconductor chip 203 and the metal films 202 are connected by the metal wires 213 (wire bonding connection).

Then, in steps shown in FIG. 8, the sealing resin 204 for sealing a plurality of semiconductor chips 203 and the metal wires 213 is formed to cover the upper surface side of the structural body shown in FIG. 7. Accordingly, the structural body corresponding to the semiconductor device 200 is formed on a portion of the adhesive film 228 corresponding to the semiconductor device forming area G.

Then, in steps shown in FIG. 9, the adhesive film 228 is removed. Then, in steps shown in FIG. 10, the sealing resin 204 and the lead frame main body 220 in positions corresponding to the cutting areas F shown in FIG. 9 are cut. Accordingly, as shown in FIG. 10, a plurality of semiconductor devices 200 are manufactured (see Patent Literature 1 (Japanese Patent Unexamined Publication No. 2002-261187), for example).

FIG. 12 is a view explaining the problem of the lead frame in the related art. In FIG. 12, the same symbols are affixed to the same configurative portions as the semiconductor device 200 shown in FIG. 1 in the related art.

However, in the lead frame 230 in the related art, in pasting the adhesive film 228 onto the lower surface of the lead frame main body 220, the lower surface 229A of the upper die 229 does not contact to the die pad portions 210 (see FIG. 5). Therefore, the upper die 229 cannot press the die pad portions 210. As a result, as shown in FIG. 12, there existed such a problem that the adhesive failure between the die pad portions 210 and the adhesive film 228 is caused. When such adhesive failure is caused, a clearance J is formed between the die pad portions 210 and the adhesive film 228.

Also, when the semiconductor chip 203 is connected the lead frame 230 in which the clearance J is formed by the wire bonding, such semiconductor chip 203 is bonded to the chip mounting surface 210A in its tilted state. Therefore, it is difficult to connect the end portions of the metal wires 213 to the electrode pads 216. As a result, there existed such a problem that a yield of the semiconductor device 200 is lowered.

In addition, when the sealing resin 204 is formed on the lead frame 230 in which the clearance J is formed, such sealing resin 204 goes round to the lower surface 210B side of the die pad portions 210. As a result, there existed such a problem that a yield of the semiconductor device 200 is lowered.

SUMMARY

Exemplary embodiments of the present invention provide a lead frame that enables an adhesive film to be pasted on a lead frame main body without intervention of a clearance and a method of manufacturing the same, and a semiconductor device capable of improving a yield when manufactured by using the lead frame.

According to an aspect of the present invention, there is provided a lead frame, comprising:

a lead frame main body having at least one die pad portion having a chip mounting surface on which a semiconductor chip is mounted, a plurality of lead portions arranged to surround the die pad portion, and a frame portion for supporting the die pad portion and the lead portions;

an adhesive film provided on a surface of the lead frame main body, which opposes a surface on which the semiconductor chip is mounted;

a first metal film provided on surfaces of the lead portions, which oppose surfaces on which the adhesive film is provided; and a second metal film, whose thickness is substantially equal to a thickness of the first metal film, provided on the chip mounting surface of the die pad portion.

According to the present invention, the second metal film whose thickness is substantially equal to the thickness of the first metal film is provided on the chip mounting area of the die pad portion. Therefore, for example, when the adhesive film is provided on the lead frame main body by using the die, the die pad portion can be pressed by the die via the second metal film. As a result, the adhesive film can be provided on the lead frame main body without intervention of the clearance between the lead frame main body and the adhesive film.

According to another aspect of the present invention, there is provided a method of manufacturing a lead frame including a lead frame main body having a die pad portion having a chip mounting surface on which a semiconductor chip is mounted, a plurality of lead portions arranged to surround the die pad portion, and a frame portion for supporting the die pad portion and the lead portions, and an adhesive film provided on a surface of the lead frame main body, which opposes a surface on which the semiconductor chip is mounted, the method comprising:

a first metal film forming step of forming a first metal film on surfaces of the lead portions, which oppose surfaces on which the adhesive film is provided;

a second metal film forming step of forming a second metal film, whose thickness is substantially equal to a thickness of the first metal film, on the chip mounting surface of the die pad portion; and an adhesive film providing step of providing the adhesive film on the lead frame main body by pressing after the first metal film and the second metal film are formed.

According to the present invention, the second metal film whose thickness is substantially equal to the thickness of the first metal film and the first metal film are provided on the chip mounting area of the die pad portion, and then the adhesive film is provided on the lead frame main body by the pressing. Therefore, for example, when the adhesive film is provided on the lead frame main body by using the die, the die pad portion can be pressed by the die via the second metal film. As a result, the adhesive film can be provided on the lead frame main body without intervention of the clearance between the lead frame main body and the adhesive film.

According to still another aspect of the present invention, there is provided a semiconductor device, comprising:

a semiconductor chip;

a lead frame main body containing a die pad portion having a chip mounting surface on which the semiconductor chip is mounted, and lead portions arranged to surround the die pad portion;

a first metal film provided on the lead portions;

a first metal wire which electrically connects the first metal film and the semiconductor chip;

a sealing resin provided on the lead frame main body to seal the semiconductor chip; and a second metal film, whose thickness is substantially equal to a thickness of the first metal film, provided on the chip mounting surface of the die pad portion.

According to the present invention, the second metal film whose thickness is substantially equal to the thickness of the first metal film is provided on the chip mounting area of the die pad portion. Therefore, for example, when the semiconductor device is manufactured by using the lead frame main body on which the adhesive film (the film used to prevent such a situation that the sealing resin goes round to the lower surface side of the lead frame main body) is provided by using the die, the die pad portion can be pressed by the die via the second metal film. As a result, the adhesive film can be pasted on the lead frame main body without intervention of the clearance.

Accordingly, such a situation can be eliminated that the semiconductor chip is adhered to the die pad portion in its tilted state with respect to the chip mounting surface. As a result, the first metal wires can be connected to the semiconductor chip with good precision, and thus a yield of the semiconductor device can be improved.

Also, the adhesive film can be pasted on the lead frame main body without intervention of the clearance. Therefore, the sealing resin never goes round to the surface of the die pad portion positioned on the opposite side to the chip mounting surface. As a result, a yield of the semiconductor device can be improved.

According to the present invention, the adhesive film can be pasted on the lead frame main body without intervention of a clearance, and also a yield of the semiconductor device can be improved.

Other features and advantages may be apparent from the following detailed description, the accompanying drawings and the claims.

DETAILED DESCRIPTION

Next, embodiments of the present invention will be explained with reference to the drawings hereinafter.

First Embodiment

Figure 1:
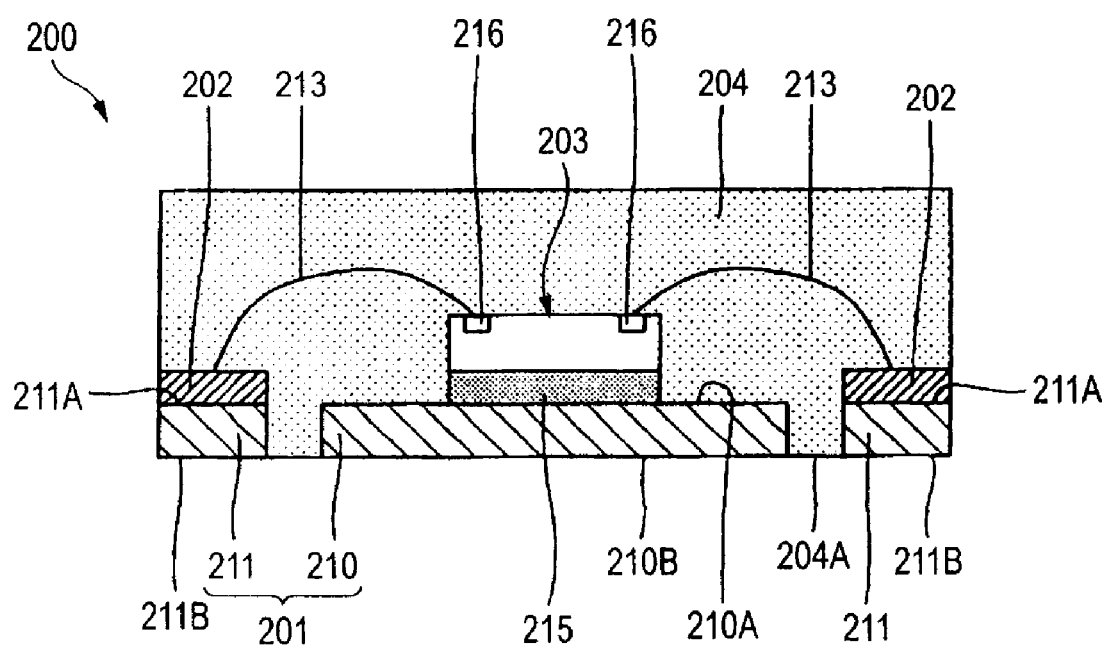
FIG. 1 is a sectional view of a semiconductor device in the related art.
Figure 2:
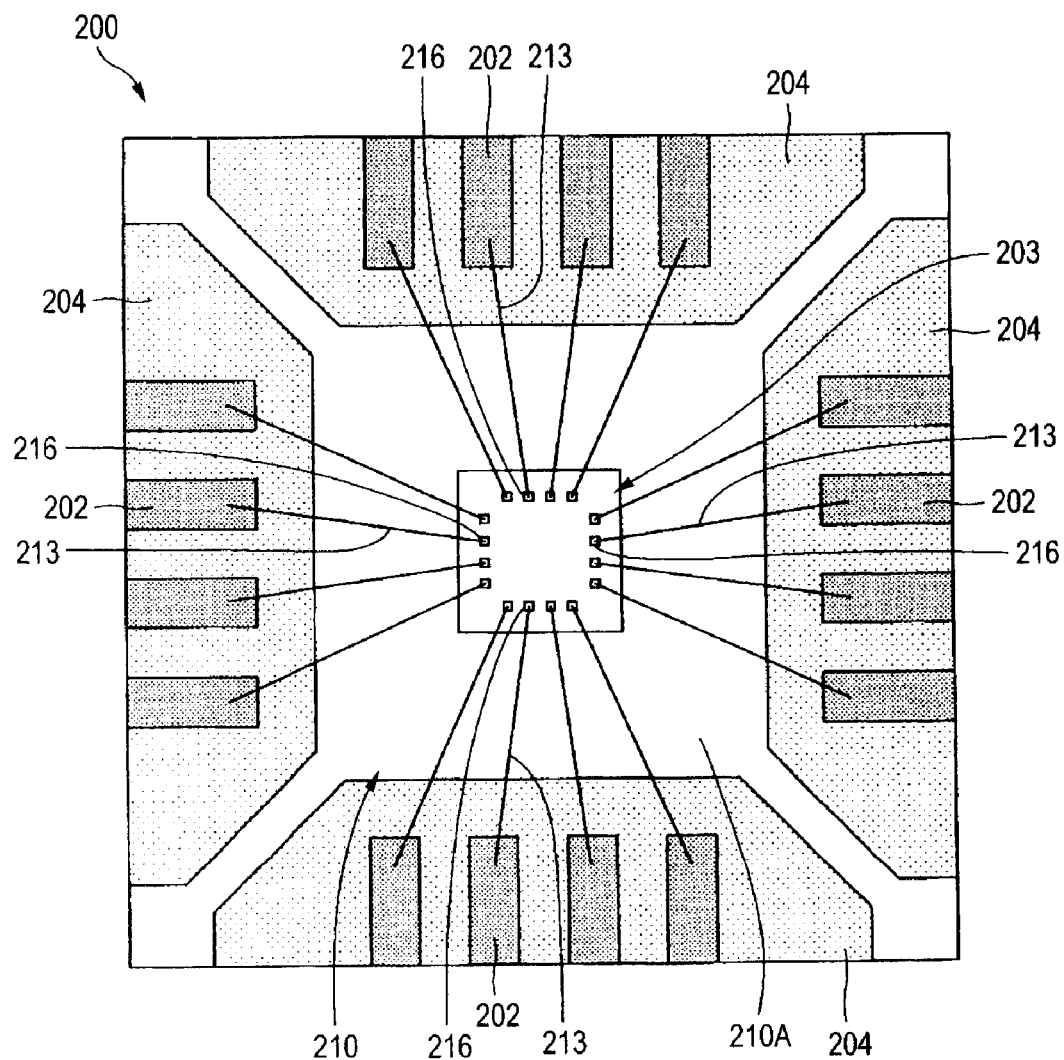
FIG. 2 is a plan view of the semiconductor device shown in FIG. 1.
Figure 3:
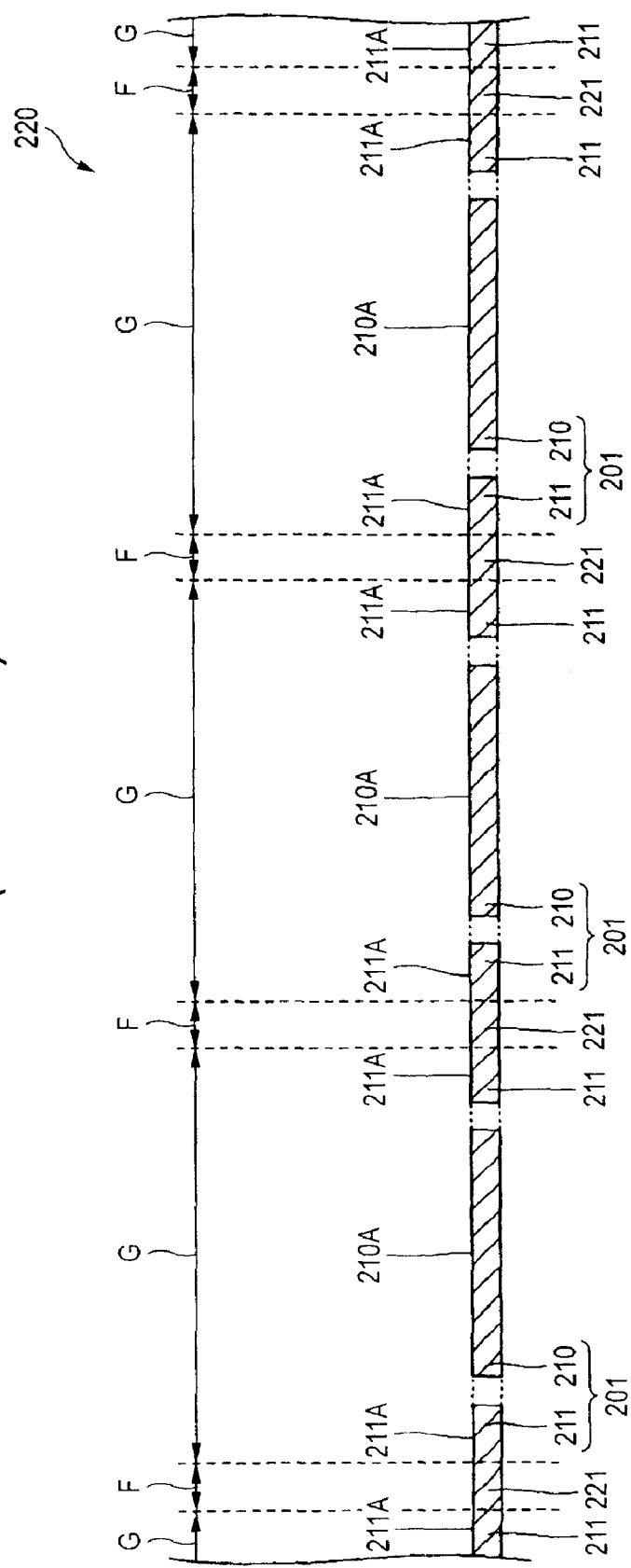
FIG. 3 is a view (#1) showing steps of manufacturing the semiconductor device in the related art.
Figure 4:
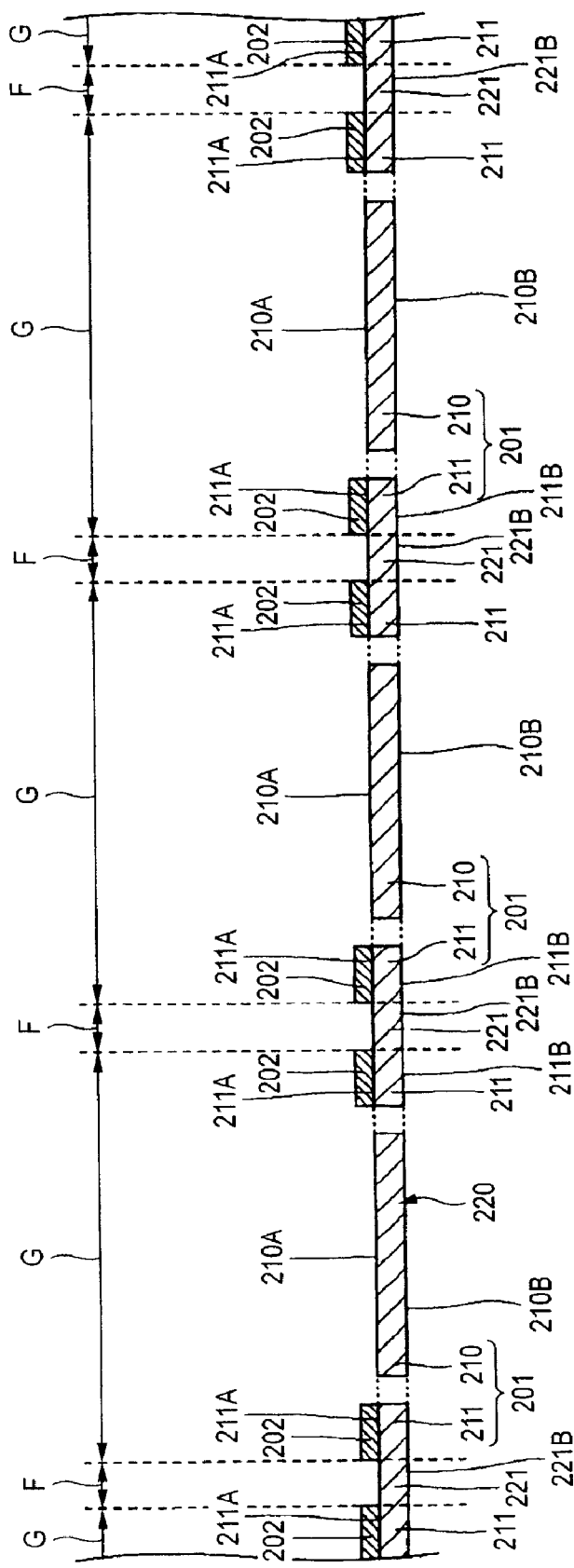
FIG. 4 is a view (#2) showing steps of manufacturing the semiconductor device in the related art.
Figure 5:
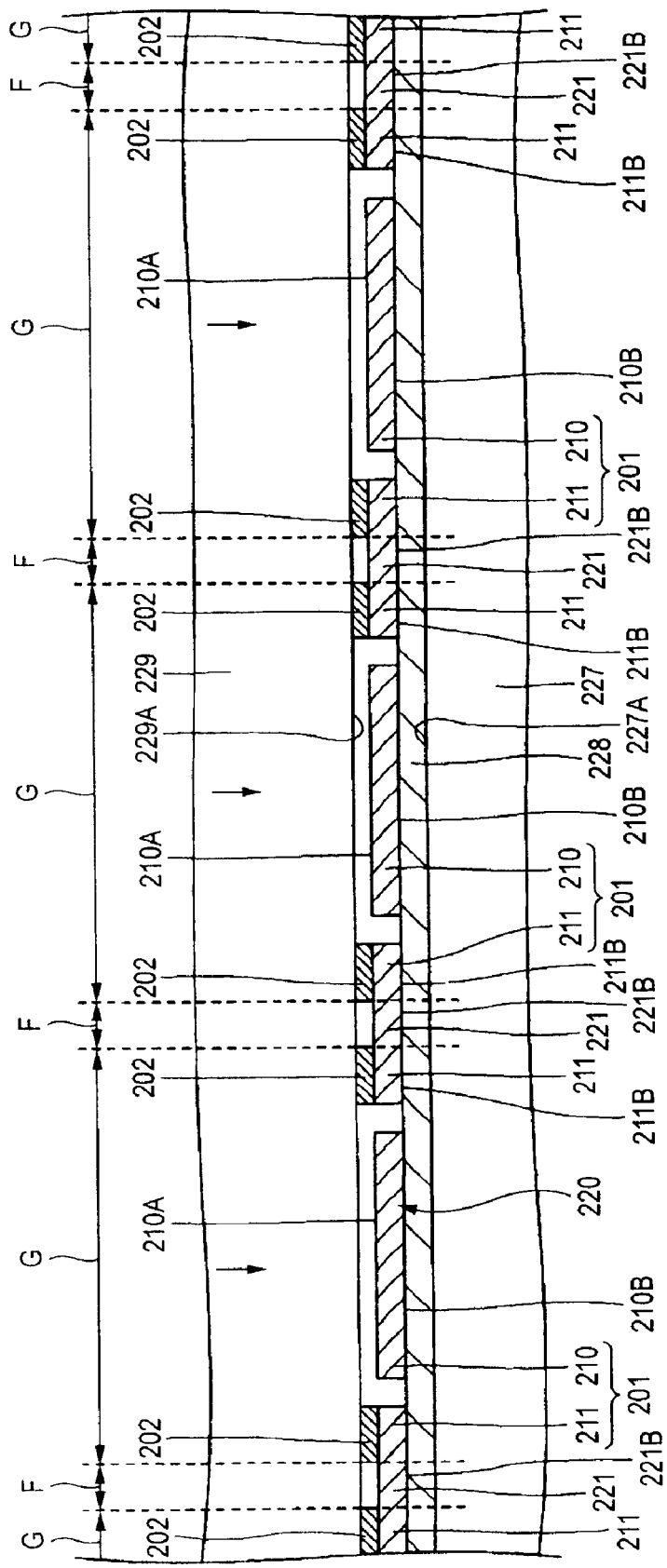
FIG. 5 is a view (#3) showing steps of manufacturing the semiconductor device in the related art.
Figure 6:
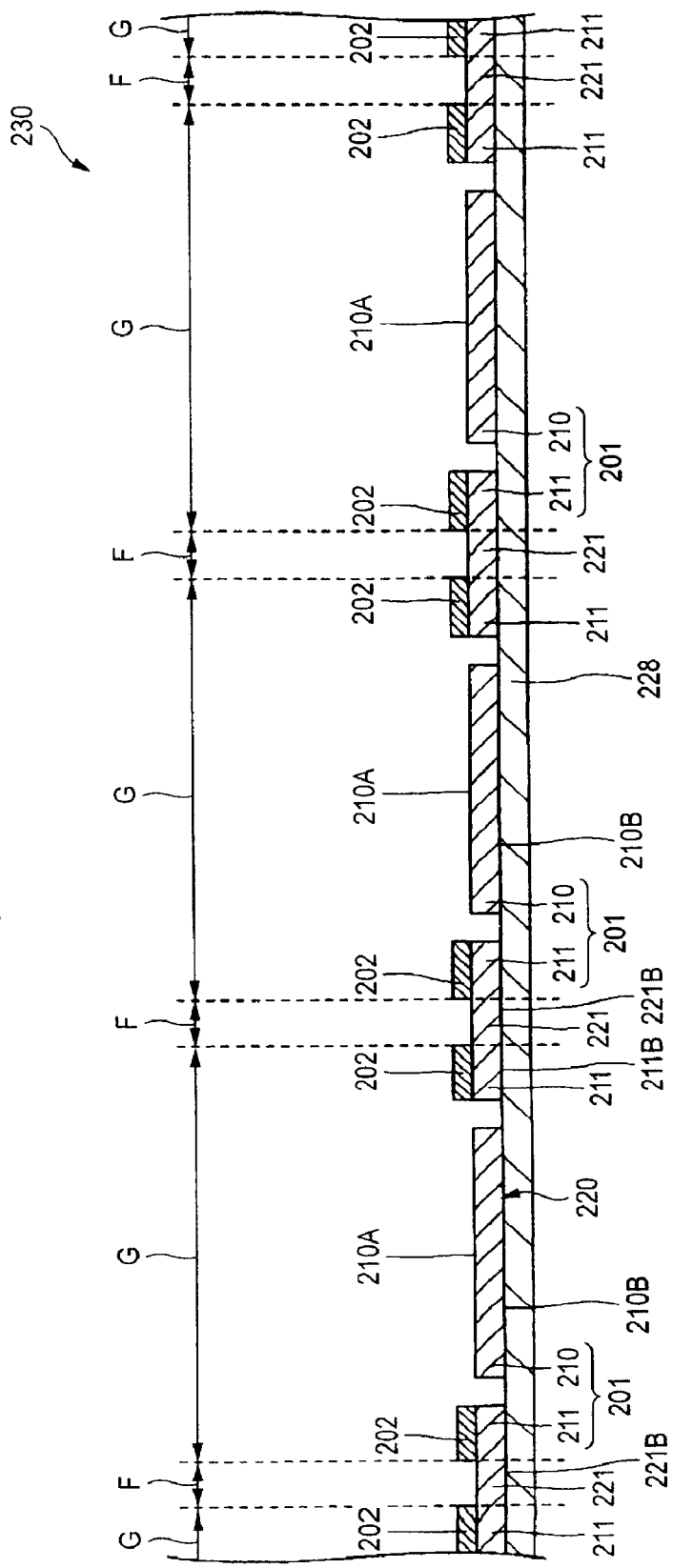
FIG. 6 is a view (#4) showing steps of manufacturing the semiconductor device in the related art.
Figure 7:
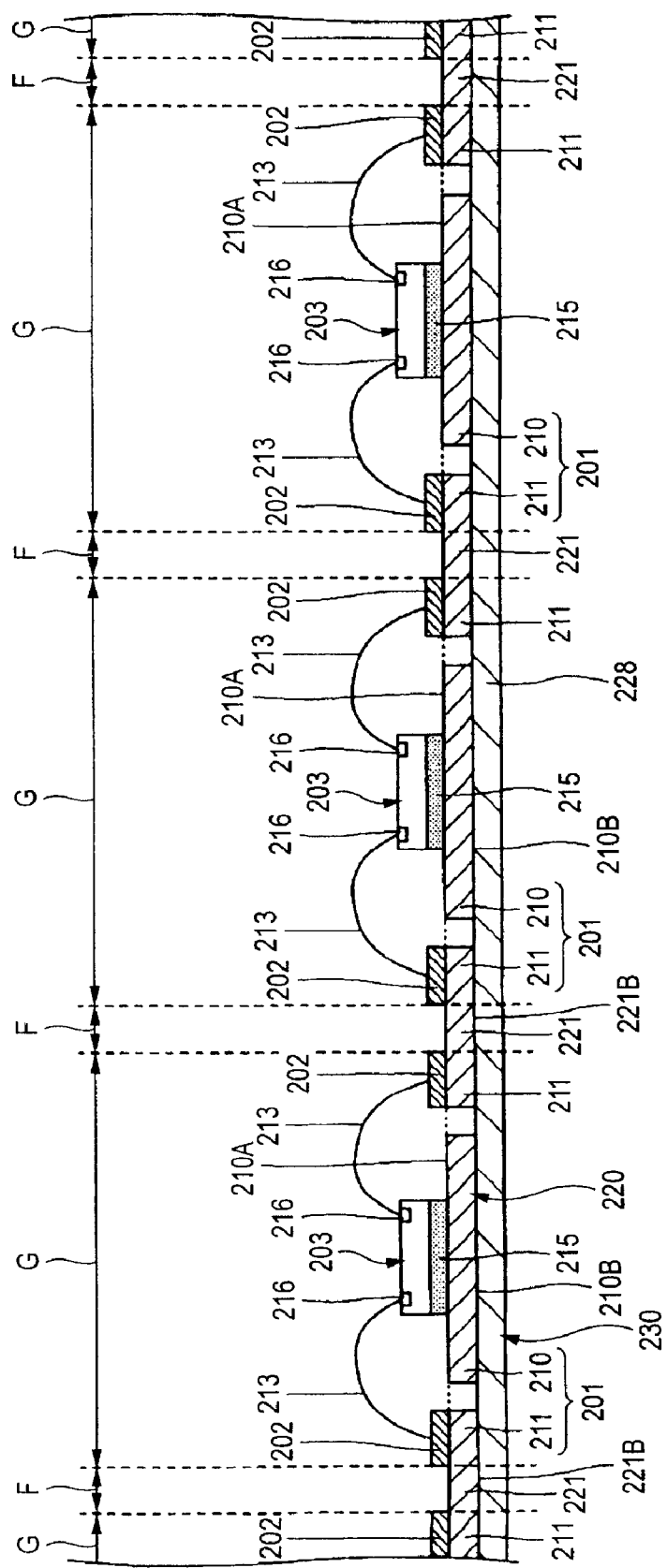
FIG. 7 is a view (#5) showing steps of manufacturing the semiconductor device in the related art.
Figure 8:
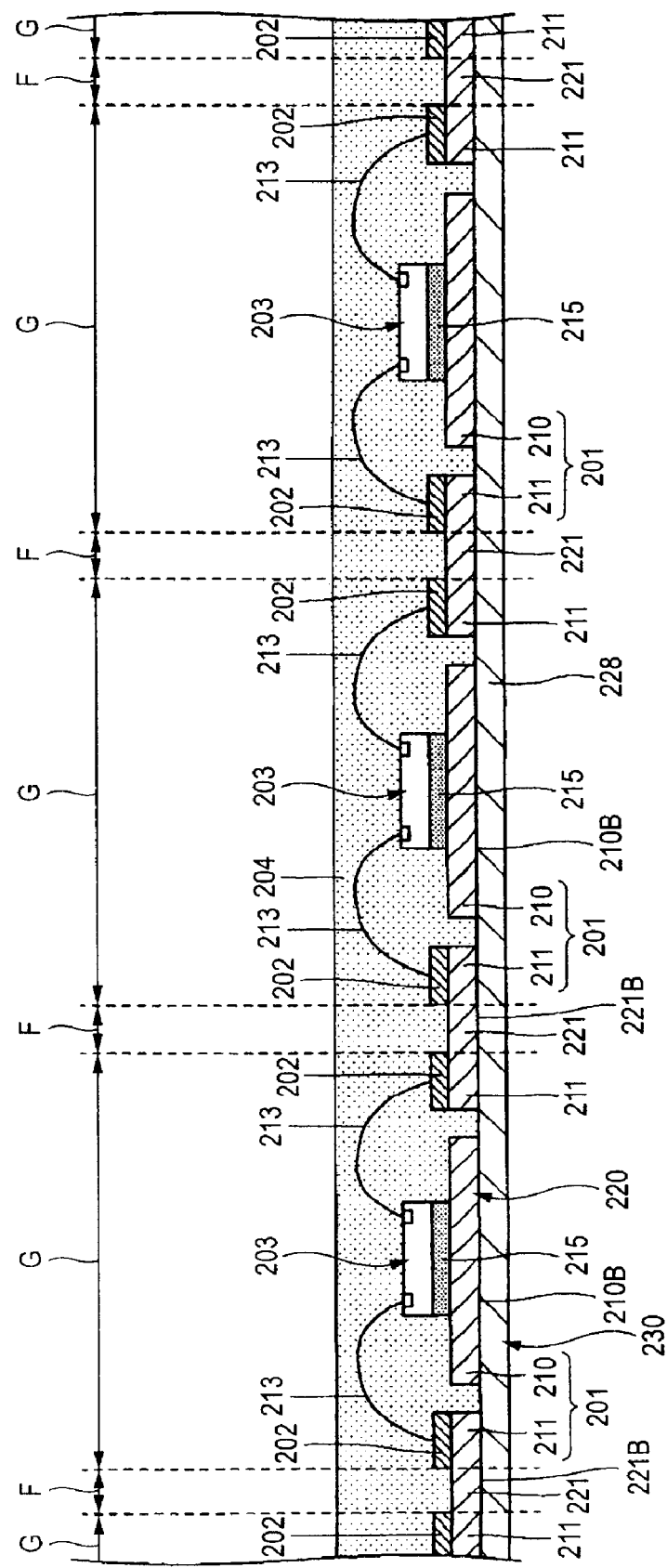
FIG. 8 is a view (#6) showing steps of manufacturing the semiconductor device in the related art.
Figure 9:
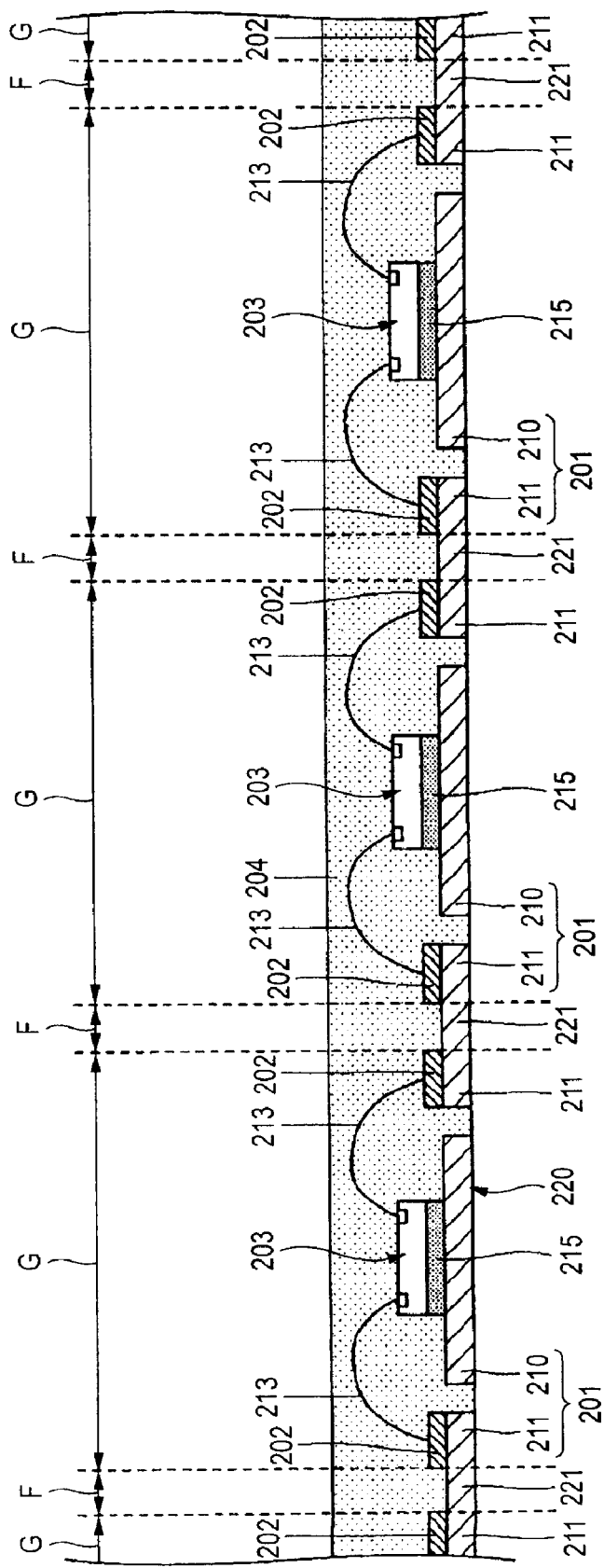
FIG. 9 is a view (#7) showing steps of manufacturing the semiconductor device in the related art.
Figure 10:
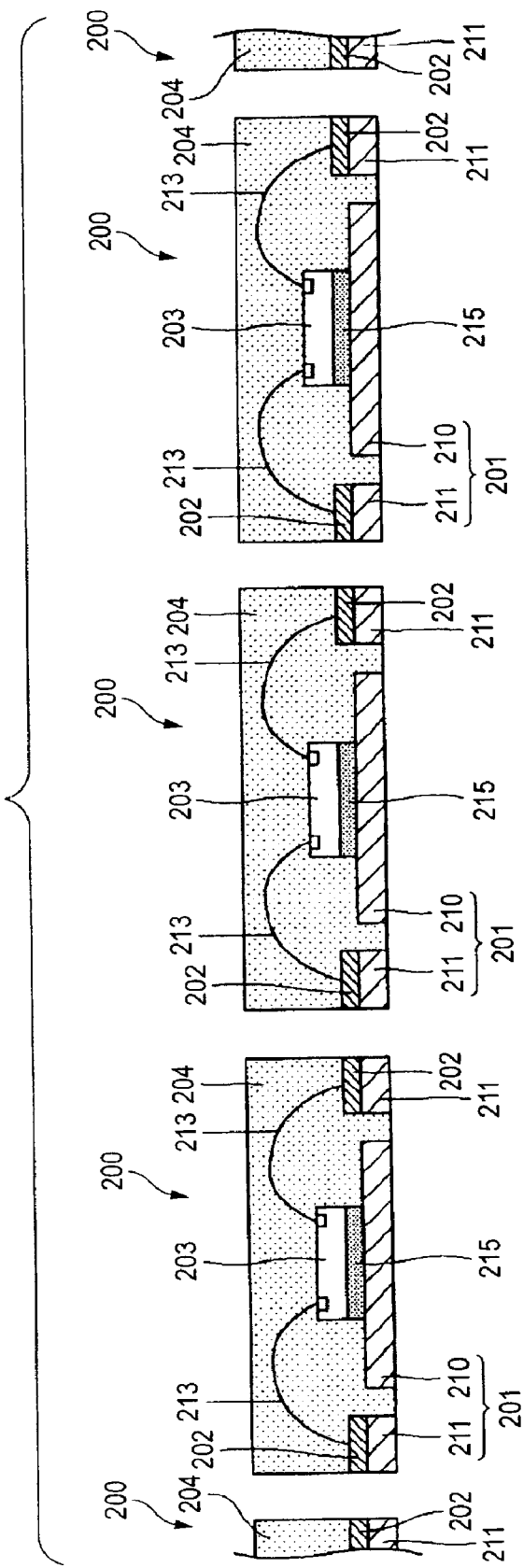
FIG. 10 is a view (#8) showing steps of manufacturing the semiconductor device in the related art.
Figure 11:
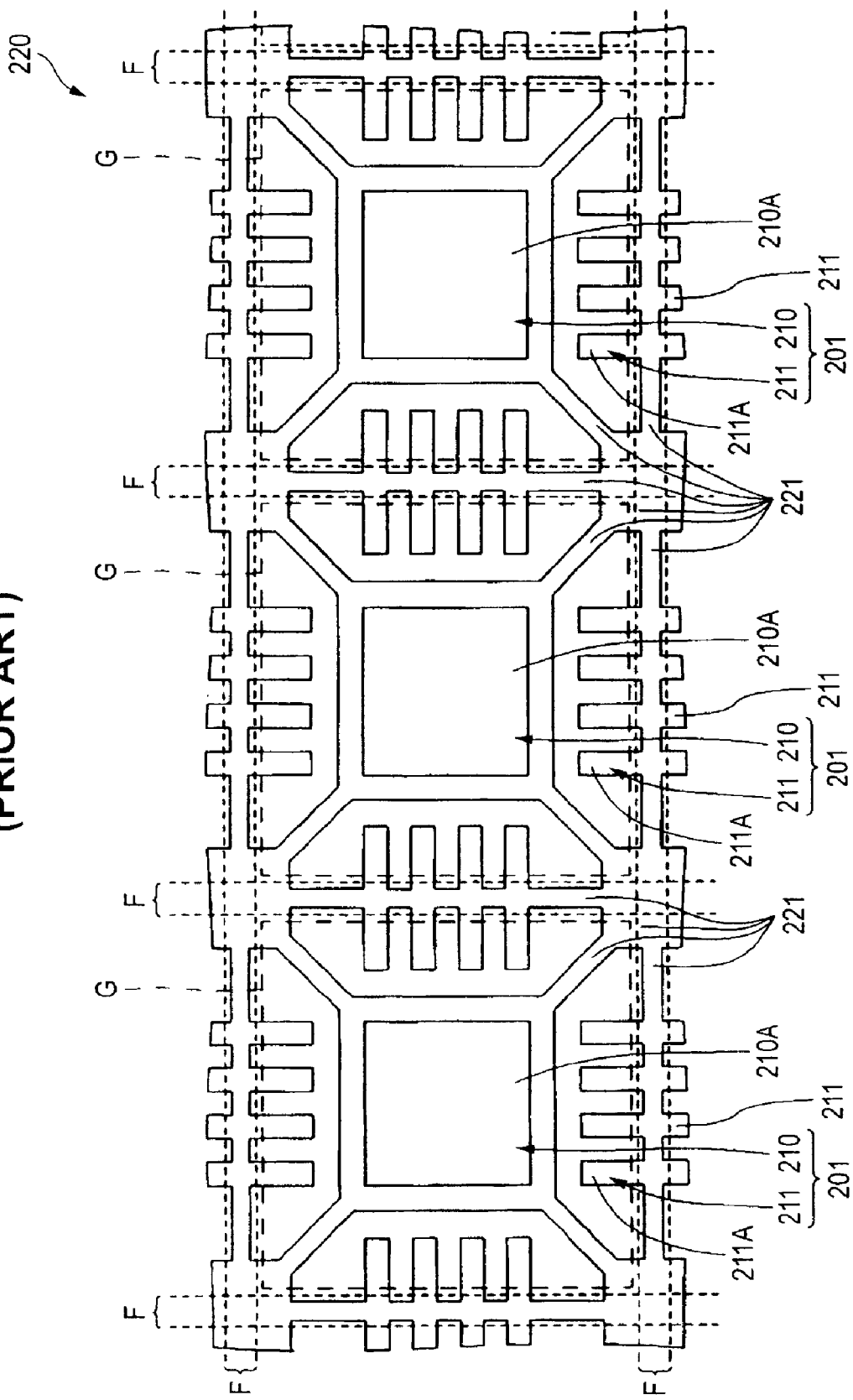
FIG. 11 is a plan view of a lead frame main body shown in FIG. 3.
Figure 12:
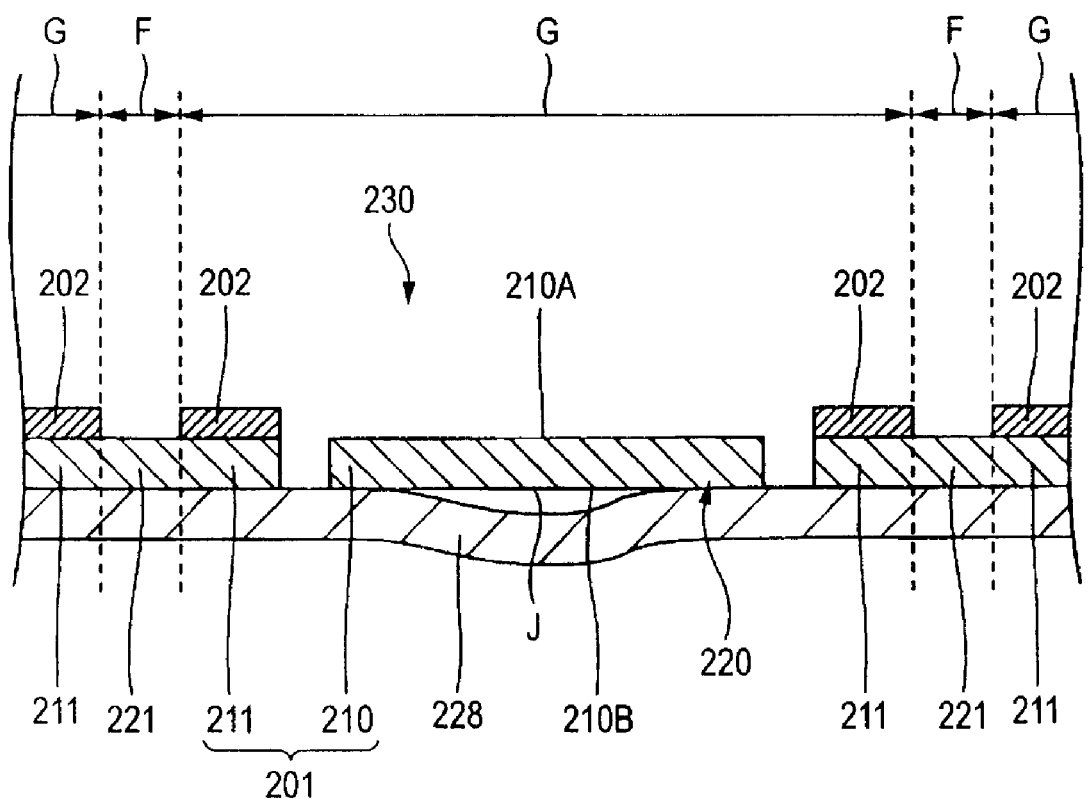
FIG. 12 is a view explaining the problem of the lead frame in the related art.
Figure 13:
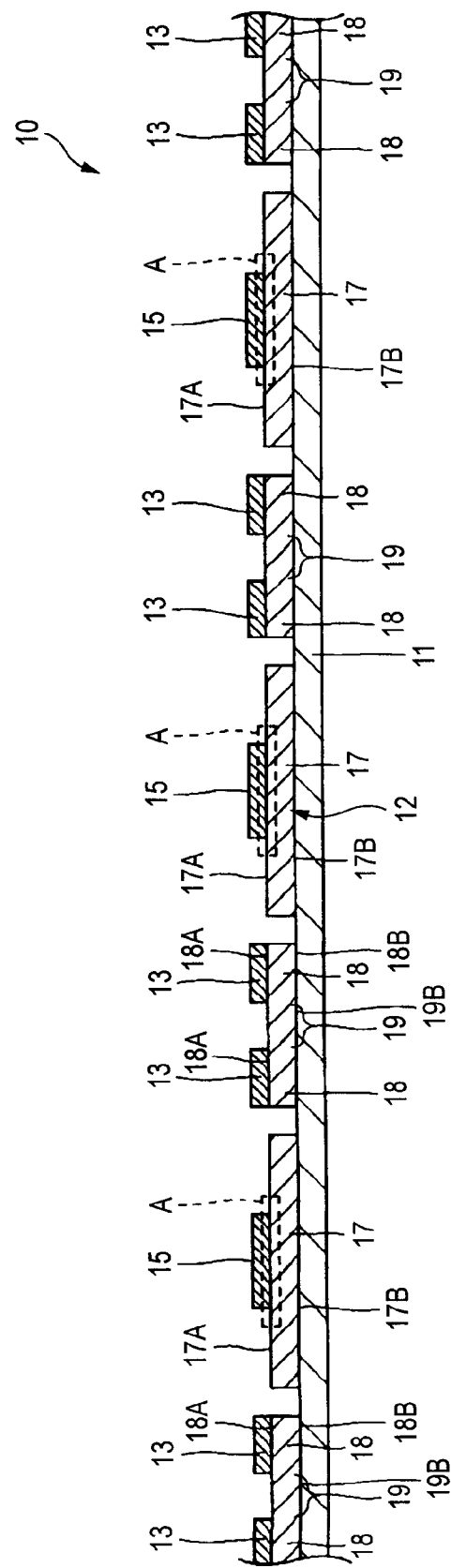
FIG. 13 is a sectional view of a lead frame according to a first embodiment of the present embodiment.

FIG. 13 is a sectional view of a lead frame according to a first embodiment of the present embodiment. In FIG. 13, A denotes an area on which the semiconductor chip is mounted (referred to as a "chip mounting area" hereinafter).

By reference to FIG. 13, a lead frame 10 has an adhesive film 11, a lead frame main body 12, first metal films 13, and a second metal film 15.

The adhesive film 11 is provided to cover the lower surface (lower surfaces 17B of die pad portions 17, lower surfaces 18B of lead portions 18, and a lower surface 19B of a frame portion 19) side of the lead frame main body 12. The adhesive film 11 has a film main body (not shown) and an adhesive (not shown) coated on the film main body. As the film main body, for example, polyimide can be used.

Also, as the adhesive, for example, the thermoplastic adhesive can be used. The adhesive film 11 is used to prevent such a situation that the sealing resin (not shown) for sealing the semiconductor chip (not shown) adhered onto the lead frame 10 goes round to the lower surface side of the lead frame main body 12. A thickness of the adhesive film 11 is can be set to 40 µm, for example.

Figure 14:
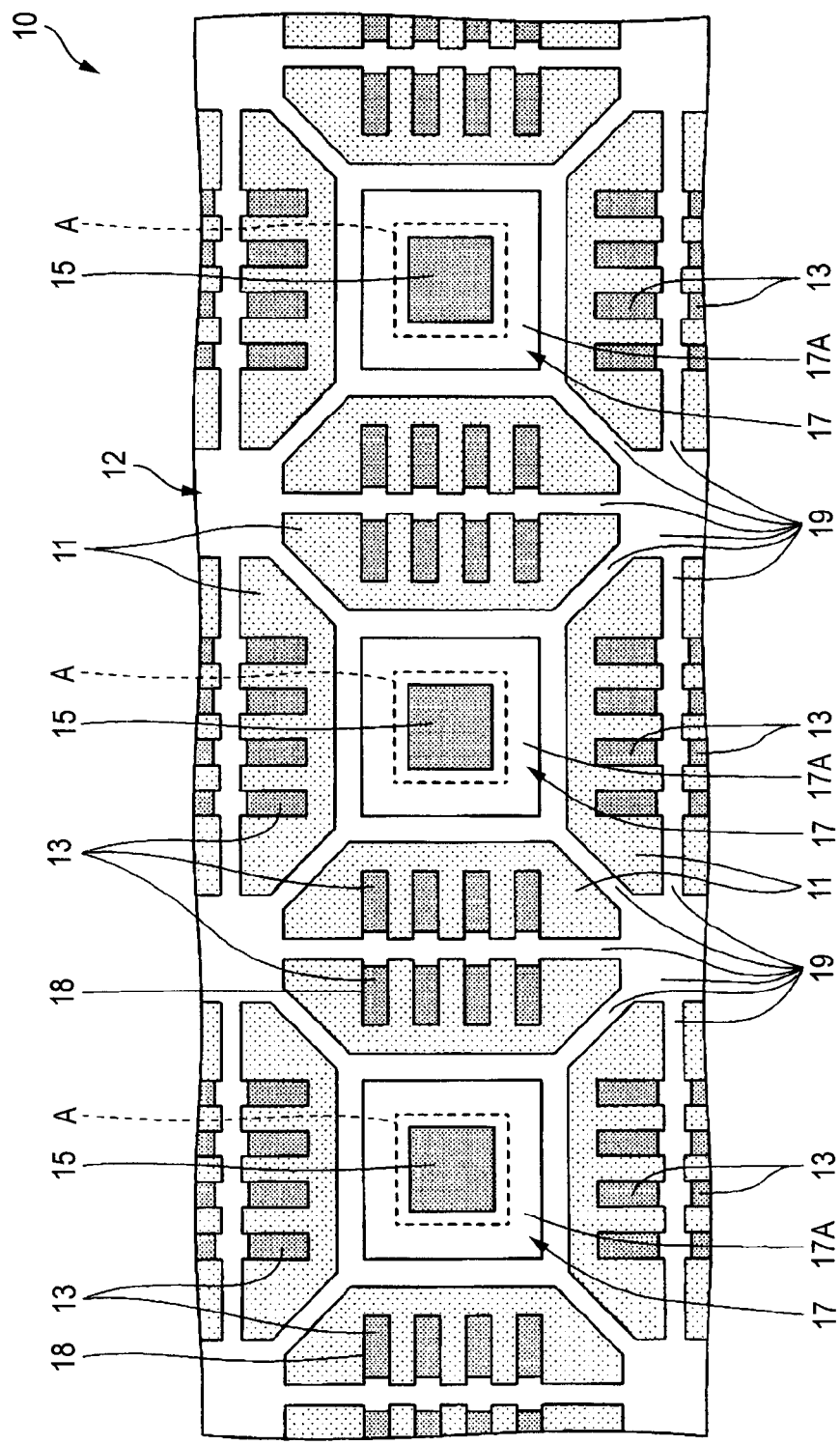
FIG. 14 is a plan view of the lead frame shown in FIG. 13.

FIG. 14 is a plan view of the lead frame shown in FIG. 13.

By reference to FIG. 13 and FIG. 14, the lead frame main body 12 has a plurality of die pad portions 17, a plurality of lead portions 18, and the frame portion 19.

A plurality of die pad portions 17 are arranged at a predetermined interval. A plurality of die pad portions 17 are supported by the frame portion 19. The die pad portion 17 has a chip mounting surface 17A on which the semiconductor chip (not shown) is mounted. Also, the die pad portion 17 has a chip mounting area A in which the semiconductor chip (not shown) is mounted. The chip mounting area A is a portion of the chip mounting surface 17A corresponding to an area in which the semiconductor chip is mounted.

A plurality of lead portions 18 are provided to the frame portion 19. A plurality of lead portions 18 are arranged to surround respective peripheries of a plurality of die pad portions 17. A plurality of lead portions 18 are arranged away from the die pad portion 17. A plurality of lead portions 18 fulfill a function of the external connection terminal when they are connected electrically to the semiconductor chip (not shown) arranged in the die pad portion 17 via the first metal films 13.

The frame portion 19 is provided to a plurality of die pad portions 17 respectively. The frame portion 19 is connected to a plurality of die pad portions 17 and a plurality of lead portions 18. The frame portion 19 is provided to support a plurality of die pad portions 17 and a plurality of lead portions 18.

The lead frame main body 12 constructed as above is manufactured by applying the etching or the press working to a metal plate. As the material of the lead frame main body 12, for example, Cu can be used. A thickness of the lead frame main body 12 can be set to 0.2 mm, for example.

The first metal film 13 is provided on upper surfaces 18A of a plurality of lead portions 18. The first metal film 13 is connected electrically to the semiconductor chip (not shown) provided in the die pad portion 17 via a metal wire (not shown). As the first metal film 13, for example, an Ag film can be used. A thickness of the first metal film 13 can be set to 2 µm to 6 µm, for example.

The second metal film 15 is provided to the chip mounting areas A of a plurality of die pad portions 17 respectively. The second metal film 15 is shaped into a square when viewed from the top. A thickness of the second metal film 15 is substantially equal to the thickness of the first metal film 13. As the second metal film 15, for example, an Ag film can be used.

In this manner, the second metal film 15 whose thickness is substantially equal to the thickness of the first metal film 13 is provided on the chip mounting areas A of a plurality of die pad portions 17 respectively. Therefore, for example, when the adhesive film 11 is pasted on the lead frame main body 12 by using the die, a plurality of die pad portions 17 can be pressed by the die via the second metal film 15, so that the adhesive film 11 can be pasted on the lead frame main body 12 not to produce a clearance between the lead frame main body 12 and the adhesive film 11. As a result, a yield of the lead frame 10 can be improved.

According to the lead frame of the present embodiment, the second metal film 15 whose thickness is substantially equal to the thickness of the first metal film 13 is provided on the chip mounting areas A of a plurality of die pad portions 17 respectively. Therefore, for example, when the adhesive film 11 is pasted on the lead frame main body 12 by pressing the lead frame main body 12 using the die, a plurality of die pad portions 17 can be pressed by the die via the second metal film 15. As a result, the adhesive film 11 can be pasted on the lead frame main body 12 without intervention of the clearance.

FIG. 15 to FIG. 18 are views showing steps of manufacturing the lead frame according to the first embodiment of the present embodiment. FIG. 19 is a plan view of the lead frame main body shown in FIG. 15. In FIG. 15 to FIG. 19, the same reference symbols are affixed to the same configurative portions as those of the lead frame 10 of the first embodiment.

Figure 15:
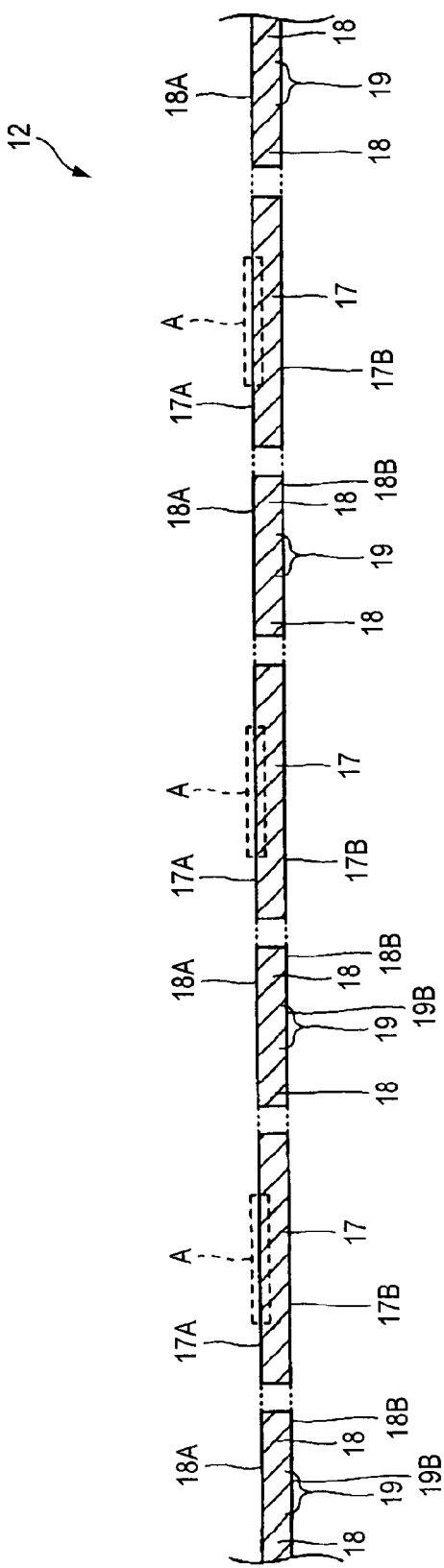
FIG. 15 is a view (#1) showing steps of manufacturing the lead frame according to the first embodiment of the present embodiment.

At first, in steps shown in FIG. 15, the lead frame main body 12 having a plurality of die pad portions 17, a plurality of lead portions 18, and the frame portion 19 is prepared (see FIG. 19).

Figure 16:
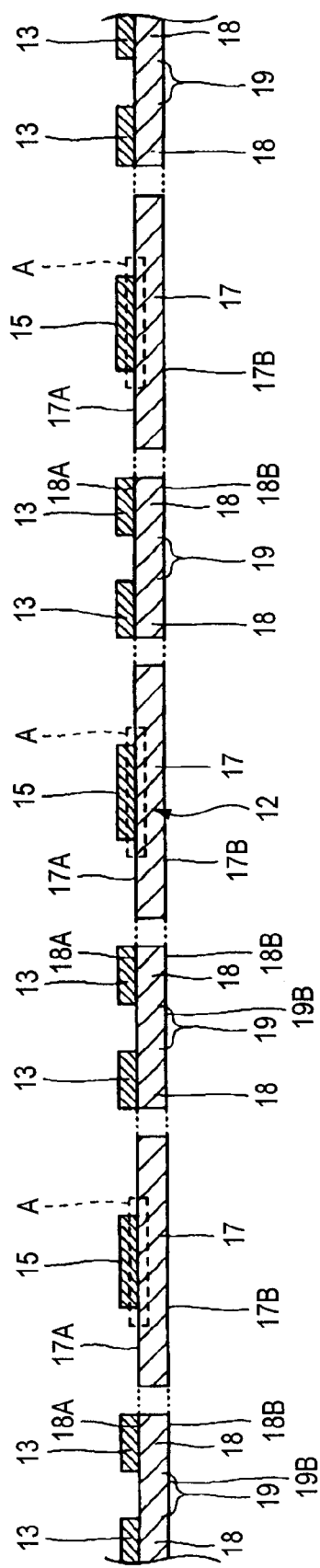
FIG. 16 is a view (#2) showing steps of manufacturing the lead frame according to the first embodiment of the present embodiment.

Then, in steps shown in FIG. 16, the first metal film 13 is formed on the upper surfaces 18A of the lead portions 18 respectively, and also the second metal film 15 whose thickness is substantially equal to the thickness of the first metal film 13 is formed in the chip mounting areas A of the die pad portions 17 respectively (first and second metal film forming steps). At this time, the first metal film 13 and the second metal film 15 are formed at the same time. Concretely, the first metal film 13 and the second metal film 15 are formed simultaneously by the partial plating method using the lead frame main body 12 as a power feeding layer.

In this manner, because the first metal film 13 and the second metal film 15 are formed simultaneously, the number of manufacturing steps can be reduced rather than the case where the first metal film 13 and the second metal film 15 are formed separately respectively. As a result, a production cost of the lead frame 10 can be reduced.

As the first metal film 13 and the second metal film 15, for example, an Ag film can be used. Also, each thickness of the first metal film 13 and the second metal film 15 can be set to 2 µm to 6 µm, for example.

Figure 17:
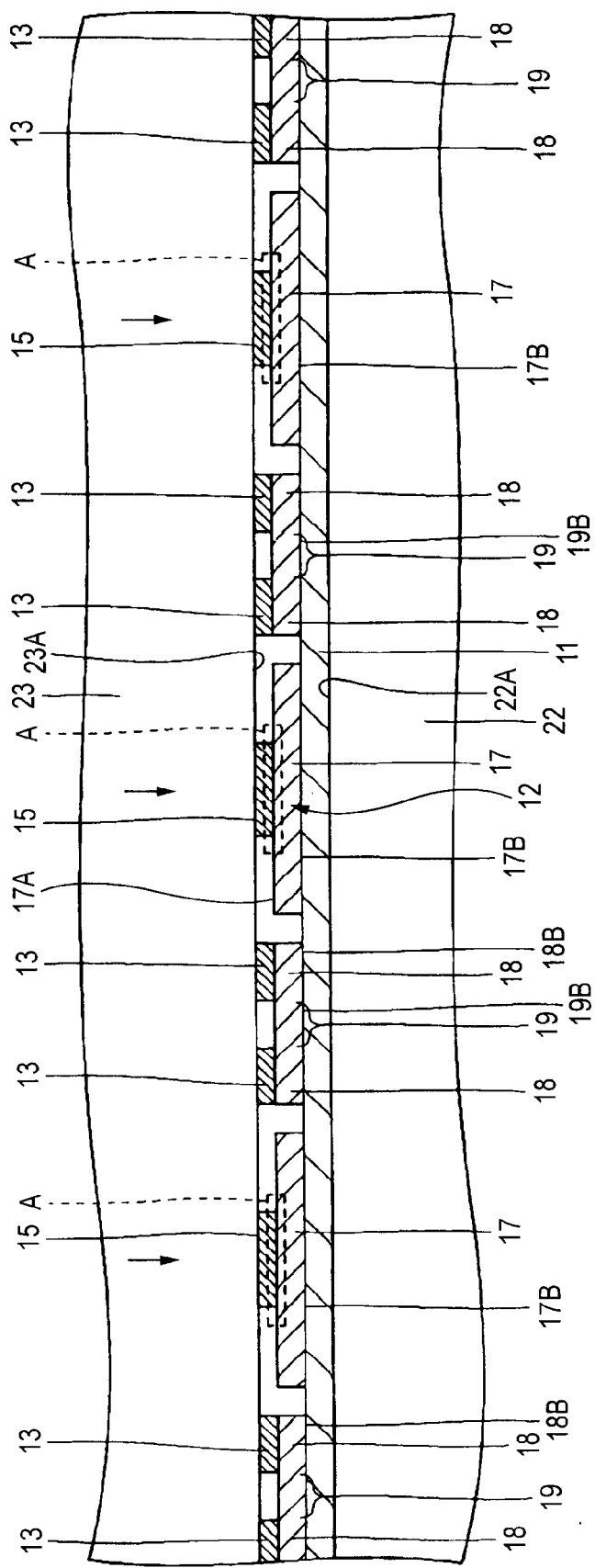
FIG. 17 is a view (#3) showing steps of manufacturing the lead frame according to the first embodiment of the present embodiment.

Then, in steps shown in FIG. 17, the adhesive film 11 is arranged on a flat upper surface 22A of a lower die 22, and then the structural body shown in FIG. 16 is put on the adhesive film 11. Then, the structural body shown in FIG. 16 is pressed by an upper die 23 while bringing a flat lower surface 23A of the upper die 23 into contact with the first metal film 13 and the second metal film 15, and thus the adhesive film 11 is pasted on the lower surface of the lead frame main body 12 (adhesive film providing step).

In this manner, first the first metal film 13 and the second metal film 15 which is provided in the chip mounting area A of a plurality of die pad portions 17 and whose thickness is substantially equal to the thickness of the first metal film 13 are formed, and then the adhesive film 11 placed on the lower die 22 is pasted on the lower surface of the lead frame main body 12 by pressing the upper die 23. Therefore, the lower surface 23A of the upper die 23 can press a plurality of die pad portions 17 via the second metal film 15. As a result, the adhesive film 11 can be pasted on the lead frame main body 12 without intervention of the clearance between the lead frame main body 12 and the adhesive film 11.

Figure 18:
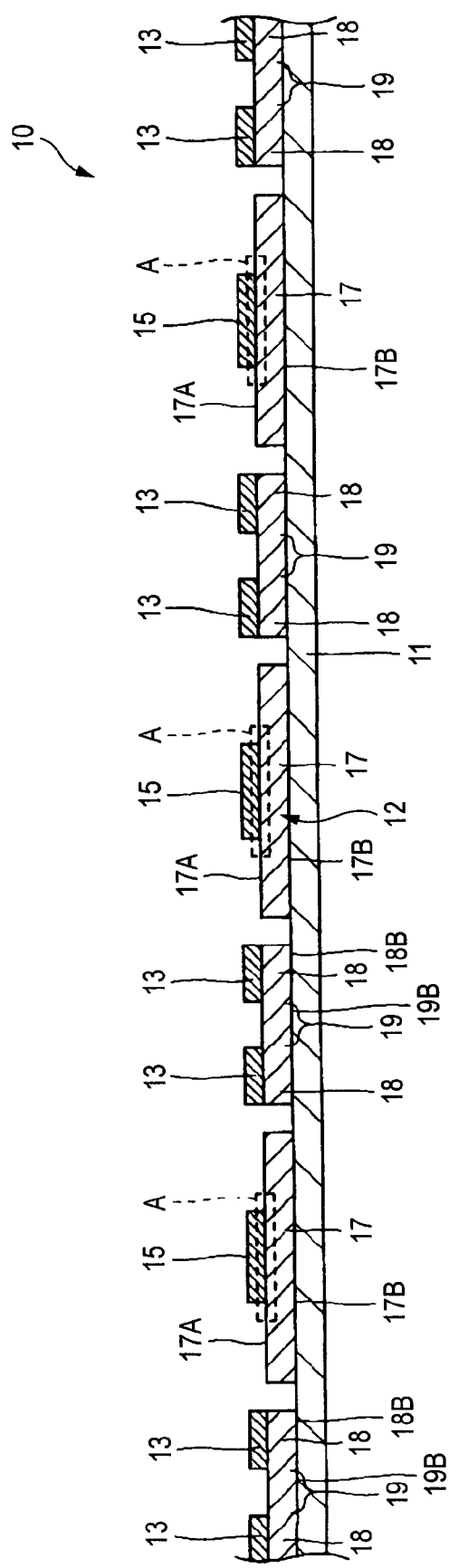
FIG. 18 is a view (#4) showing steps of manufacturing the lead frame according to the first embodiment of the present embodiment.
Figure 19:
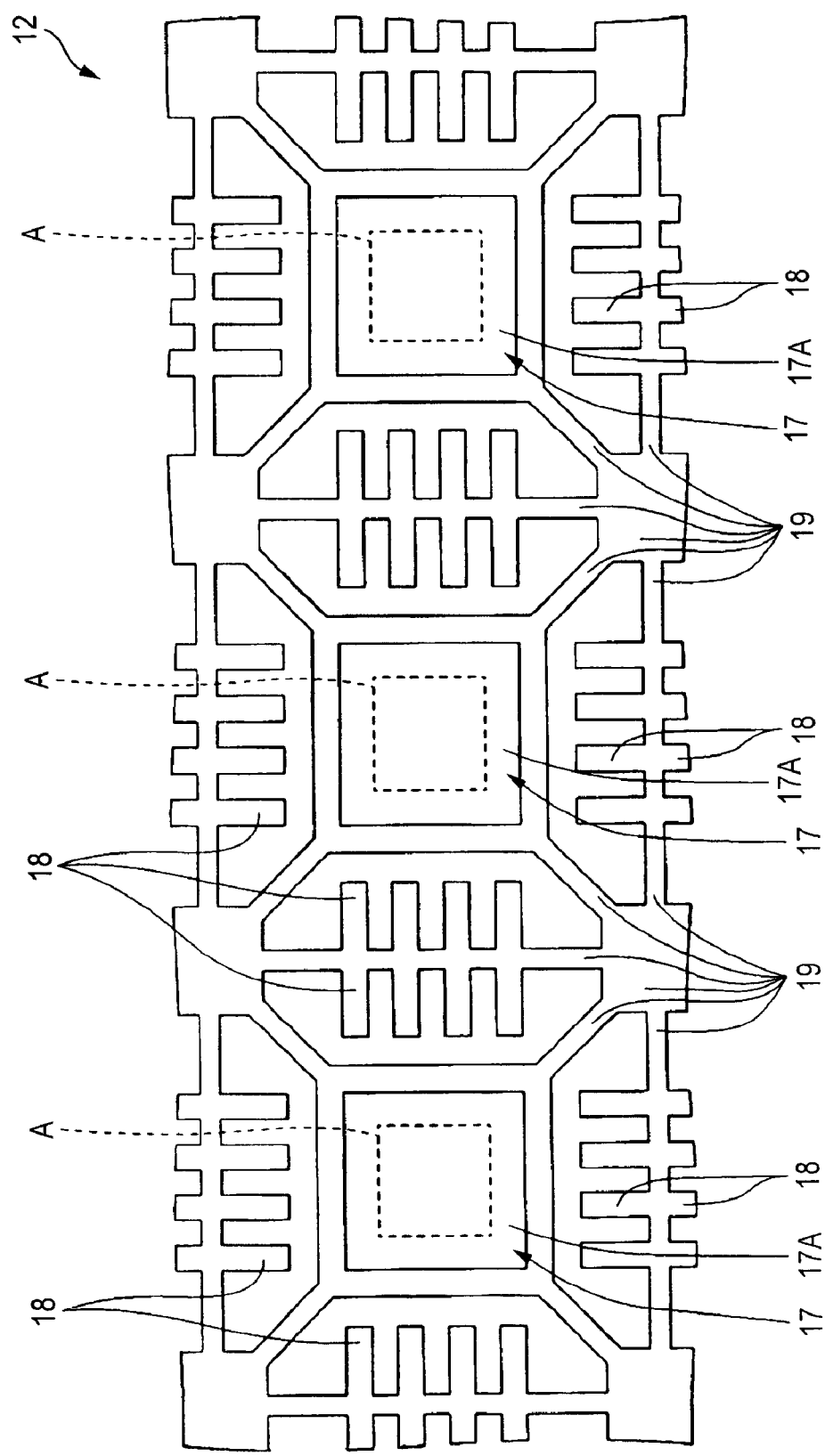
FIG. 19 is a plan view of a lead frame main body shown in FIG. 15.

Then, in steps shown in FIG. 18, the lead frame main body 12 onto which the adhesive film 11 is pasted is stripped off the lower die 22 and the upper die 23 shown in FIG. 17. Accordingly, the lead frame 10 having the adhesive film 11, the lead frame main body 12, and the first metal films 13 and the second metal films 15 is manufactured.

According to the method of manufacturing the lead frame according to the present embodiment, first the first metal film 13 and the second metal film 15 which is provided in the chip mounting area A of a plurality of die pad portions 17 and whose thickness is substantially equal to the thickness of the first metal film 13 are formed, and then the adhesive film 11 arranged on the lower die 22 is pasted on the lower surface of the lead frame main body 12 by pressing the upper die 23. Therefore, a plurality of die pad portions 17 can be pressed by the lower surface 23A of the upper die 23 via the second metal film 15. As a result, the adhesive film 11 can be pasted on the lead frame main body 12 without intervention of the clearance between the lead frame main body 12 and the adhesive film 11.

Second Embodiment

Figure 20:
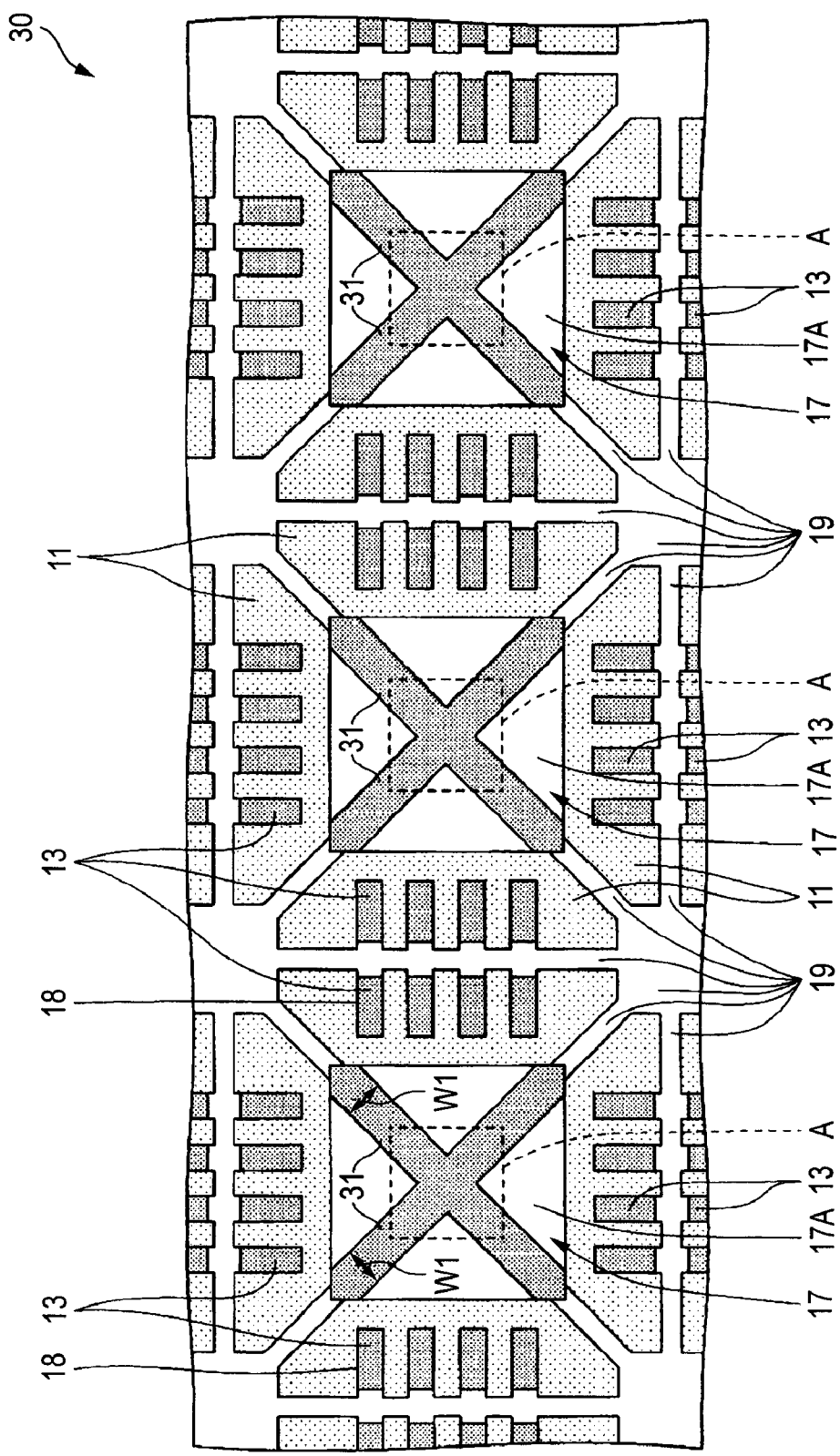
FIG. 20 is a plan view of a lead frame according to a second embodiment of the present invention.

FIG. 20 is a plan view of a lead frame according to a second embodiment of the present invention. In FIG. 20, the same reference symbols are affixed to the same configurative portions as those of the lead frame 10 of the first embodiment.

By reference to FIG. 20, a lead frame 30 of the second embodiment is constructed similarly to the lead frame 10, except that a second metal film 31 is provided instead of the second metal film 15 provided to the lead frame 10 in the first embodiment respectively.

The second metal film 31 is formed like an X-shape when viewed from the top. The second metal film 31 is provided to a portion of the chip mounting surface 17A corresponding to the chip mounting area A and another portion of the chip mounting surface 17A positioned on the outer side than the chip mounting area A. A thickness of the second metal film 31 is set substantially equal to a thickness of the first metal film 13. Also, a width W1 of the second metal film 31 can be set to 100 µm, for example. As the second metal film 31, for example, an Ag film can be used.

In this manner, the second metal film 31 whose thickness is substantially equal to a thickness of the first metal film 13 is provided to a portion of the chip mounting surface 17A corresponding to the chip mounting area A and another portion of the chip mounting surface 17A positioned on the outer side than the chip mounting area A. Therefore, for example, when the adhesive film 11 is pasted onto the lead frame main body 12 by using the die, center portions and outer peripheral portions of a plurality of die pad portions 17 can be pressed by the die via the second metal film 31. As a result, the adhesive film 11 can be pasted on the lead frame main body 12 with good precision without intervention of the clearance between the lead frame main body 12 and the adhesive film 11. Consequently, a yield of the lead frame 30 can be improved in contrast to the lead frame 10 of the first embodiment in which the second metal film 15 is provided only in the chip mounting area A.

According to the lead frame of the present embodiment, the second metal film 31 whose thickness is substantially equal to a thickness of the first metal film 13 is provided to a portion of the chip mounting surface 17A corresponding to the chip mounting area A and another portion of the chip mounting surface 17A positioned on the outer side than the chip mounting area A. Therefore, when the adhesive film 11 is pasted onto the lead frame main body 12 by using the die, the center portions and the outer peripheral portions of a plurality of die pad portions 17 can be pressed by the die via the second metal film 31. As a result, the adhesive film 11 can be pasted on the lead frame main body 12 with good precision.

In this case, the lead frame 30 of the present embodiment can be manufactured by the same approach as the lead frame 10 in the first embodiment.

Figure 21:
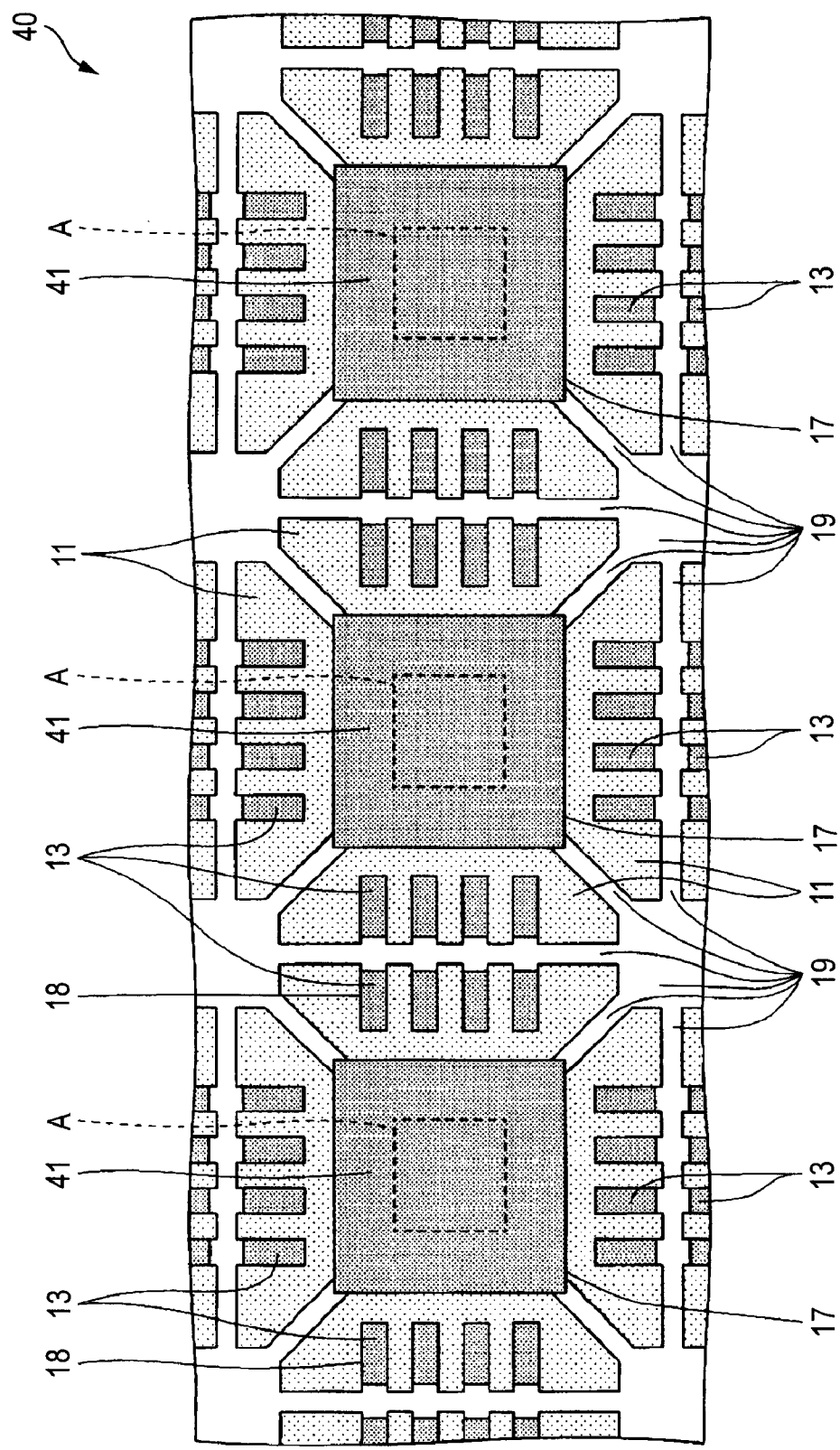
FIG. 21 is a plan view of a lead frame according to a variation of the second embodiment of the present invention.

FIG. 21 is a plan view of a lead frame according to a variation of the second embodiment of the present invention. In FIG. 21, the same reference symbols are affixed to the same configurative portions as those of the lead frame 30 of the second embodiment.

By reference to FIG. 21, a lead frame 40 according to a variation of the second embodiment is constructed similarly to the lead frame 30 in the second embodiment, except that a second metal film 41 is provided instead of the second metal film 31 provided to the lead frame 30 in the second embodiment respectively. The second metal film 41 is provided to the chip mounting surfaces 17A (not shown) of a plurality of die pad portions 17 respectively. A thickness of the second metal film 41 is set substantially equal to a thickness of the first metal film 13. As the second metal film 41, for example, an Ag film can be used.

In this manner, the second metal film 41 whose thickness is substantially equal to a thickness of the first metal film 13 is provided to cover the chip mounting surfaces 17A (not shown) of a plurality of die pad portions 17 respectively. Therefore, when the adhesive film 11 is pasted onto the lead frame main body 12 by using the die, a plurality of die pad portions 17 can be pressed all together by the die via the second metal film 41. As a result, the adhesive film 11 can be pasted on the lead frame main body 12 with high precision.

Third Embodiment

Figure 22:
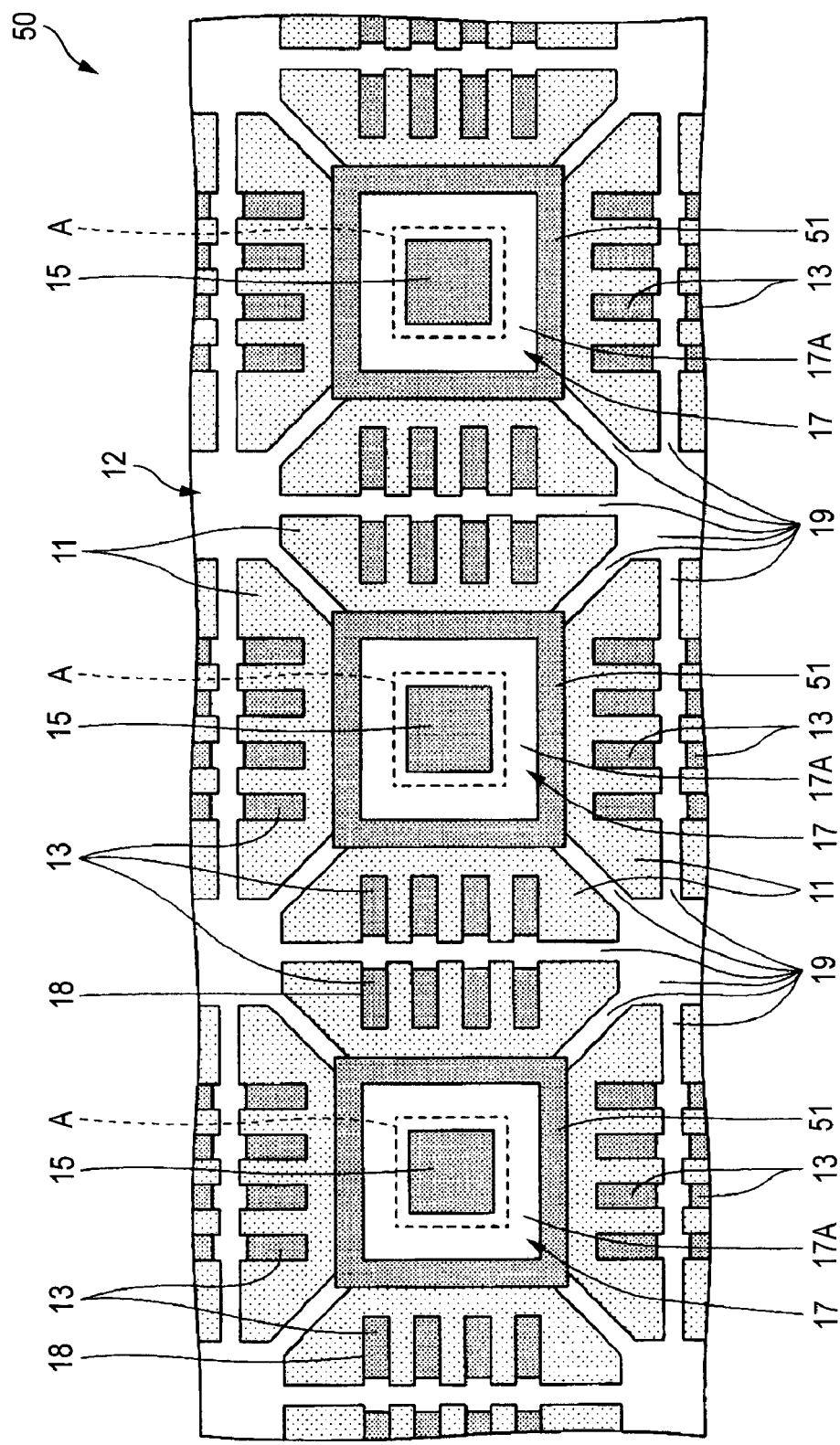
FIG. 22 is a plan view of a lead frame according to a third embodiment of the present invention.

FIG. 22 is a plan view of a lead frame according to a third embodiment of the present invention. In FIG. 22, the same reference symbols are affixed to the same configurative portions as those of the lead frame 10 of the first embodiment.

By reference to FIG. 22, a lead frame 50 of the third embodiment is constructed similarly to the lead frame 10, except that a third metal film 51 is provided further to the lead frame 10 in the second embodiment respectively.

The third metal film 51 is provided a portion of the chip mounting surface 17A being positioned on the outside of the chip mounting area A of a plurality of die pad portions 17 respectively. The third metal film 51 is formed in a frame shape when viewed from the top. A thickness of the third metal film 51 is formed substantially equal to a thickness of the first metal film 13. The third metal film 51 is connected electrically to the semiconductor chip (not shown) being provided in the chip mounting area A of the die pad portion 17 via the metal wire (not shown). As the third metal film 51, for example, an Ag film can be used. A thickness of the third metal film 51 can be set to 2 µm to 6 µm, for example.

In this manner, the second metal film 15 whose thickness is substantially equal to a thickness of the first metal film 13 is provided to the chip mounting area A of a plurality of die pad portions 17 respectively, and also the third metal film 51 whose thickness is set substantially equal to a thickness of the first metal film 13 is provided to a portion of the chip mounting surface 17A positioned on the outer side than the chip mounting area A of a plurality of die pad portions 17 respectively. Therefore, for example, when the adhesive film 11 is pasted onto the lead frame main body 12 by using the die, center portions and outer peripheral portions of a plurality of die pad portions 17 can be pressed by the die via the second metal film 15 and the third metal film 51. As a result, the adhesive film 11 can be pasted on the lead frame main body 12 with good precision without intervention of the clearance between the lead frame main body 12 and the adhesive film 11. Consequently, a yield of the lead frame 50 can be improved.

According to the lead frame of the present embodiment, the second metal film 15 whose thickness is substantially equal to a thickness of the first metal film 13 is provided to the chip mounting area A of a plurality of die pad portions 17 respectively, and also the third metal film 51 whose thickness is set substantially equal to a thickness of the first metal film 13 is provided to a portion of the chip mounting surface 17A positioned on the outer side than the chip mounting area A of a plurality of die pad portions 17 respectively. Therefore, when the adhesive film 11 is pasted onto the lead frame main body 12 by using the die, the center portions and the outer peripheral portions of a plurality of die pad portions 17 can be pressed by the die via the second metal film 15 and the third metal film 51. As a result, the adhesive film 11 can be pasted on the lead frame main body 12 with good precision.

Figure 23:
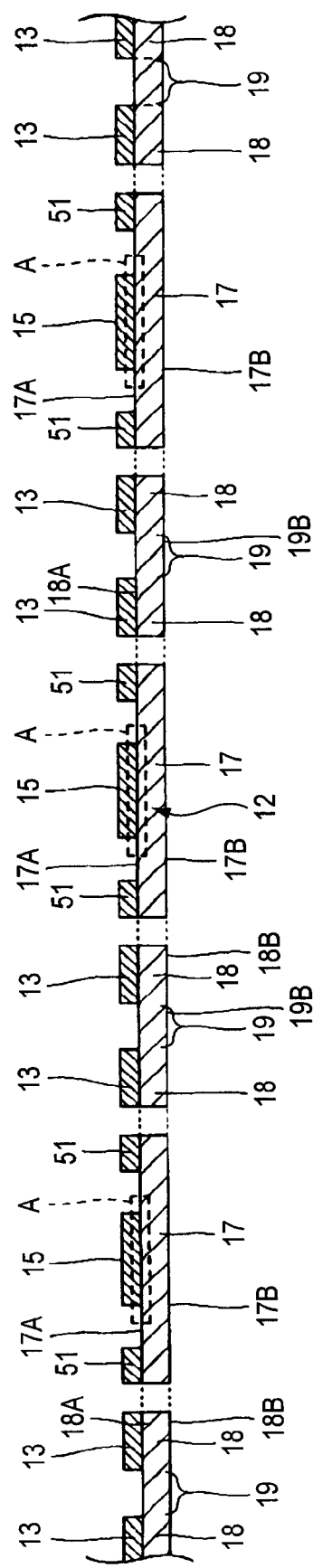
FIG. 23 is a view (#1) showing steps of manufacturing the lead frame according to the third embodiment of the present embodiment.
Figure 24:
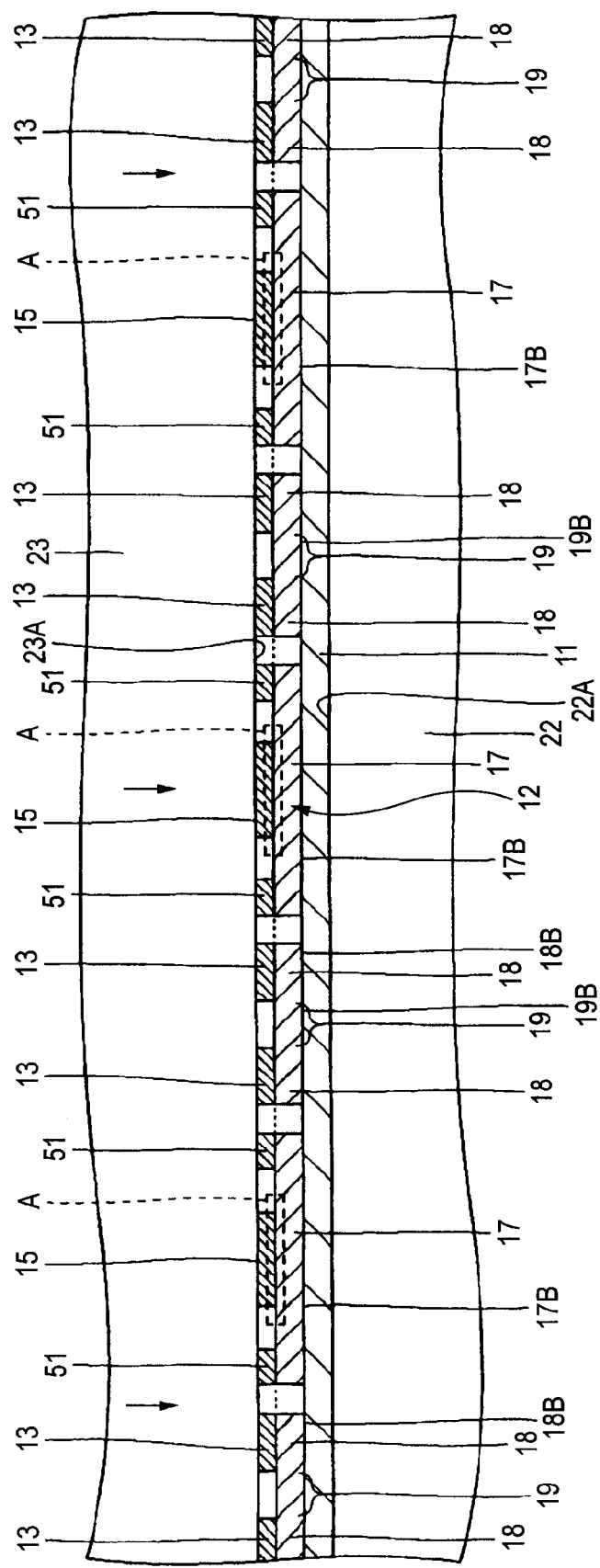
FIG. 24 is a view (#2) showing steps of manufacturing the lead frame according to the third embodiment of the present embodiment.
Figure 25:
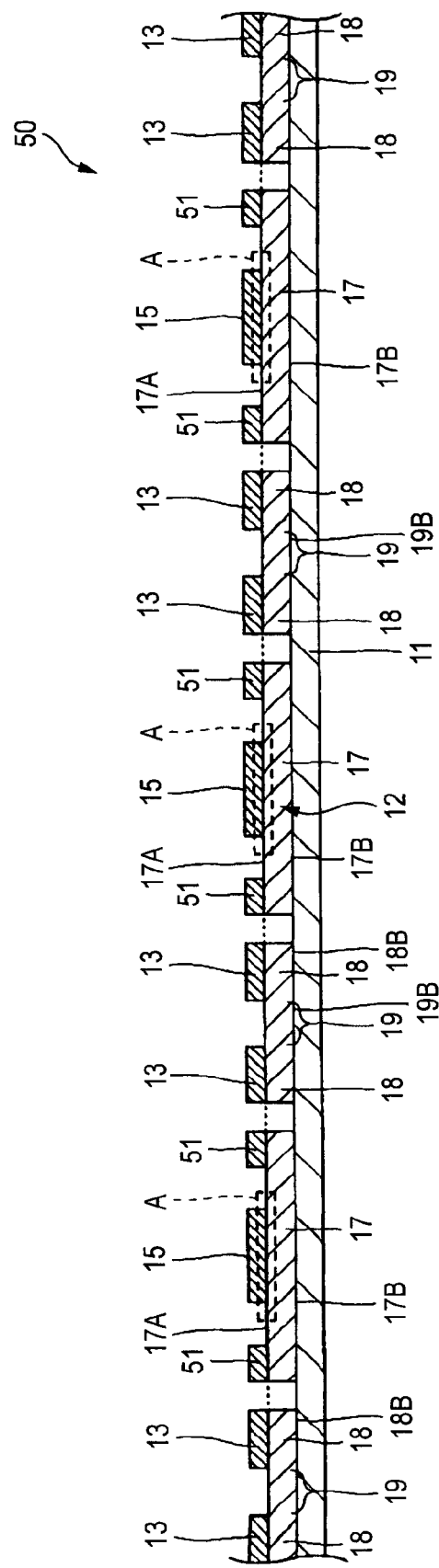
FIG. 25 is a view (#3) showing steps of manufacturing the lead frame according to the third embodiment of the present embodiment.

FIG. 23 to FIG. 25 are views showing steps of manufacturing the lead frame according to the third embodiment of the present embodiment. In FIG. 23 to FIG. 25, the same reference symbols are affixed to the same configurative portions as those of the lead frame 50 of the third embodiment.

At first, in steps shown in FIG. 23, the first metal film 13 is formed on the upper surfaces 18A of a plurality of lead portions 18 respectively, and the second and third metal films 15, 51 whose thickness is set substantially equal to a thickness of the first metal film 13 are formed on the chip mounting surfaces 17A of a plurality of die pad portions 17 respectively (first to third metal film forming steps). At this time, the first to third metal films 13, 15, 51 are formed at the same time. Concretely, the first to third metal films 13, 15, 51 are formed simultaneously by the partial plating method using the lead frame main body 12 as a power feeding layer.

In this manner, because the first to third metal films 13, 15, 51 are formed simultaneously, the number of manufacturing steps can be reduced rather than the case where the first to third metal films 13, 15, 51 are formed separately respectively. As a result, a production cost of the lead frame 50 can be reduced.

As the first to third metal films 13, 15, 51, for example, an Ag film can be used. Also, each thickness of the first to third metal films 13, 15, 51 can be set to 2 μm to 6 μm, for example.

Then, in steps shown in FIG. 24, the adhesive film 11 is arranged on the flat upper surface 22A of the lower die 22, and then the structural body shown in FIG. 23 is put on the adhesive film 11. Then, the structural body shown in FIG. 23 is pressed by the upper die 23 while bringing the flat lower surface 23A of the upper die 23 into contact with the first to third metal films 13, 15, 51, and thus the adhesive film 11 is pasted on the lower surface of the lead frame main body 12 (adhesive film providing step).

In this manner, the second metal film 15 whose thickness is substantially equal to a thickness of the first metal film 13 is provided to the chip mounting area A of a plurality of die pad portions 17 respectively, and also the third metal film 51 whose thickness is set substantially equal to a thickness of the first metal film 13 is provided to a portion of the chip mounting surface 17A positioned on the outer side than the chip mounting area A of a plurality of die pad portions 17 respectively, and then the adhesive film 11 placed on the lower die 22 is pasted on the lower surface of the lead frame main body 12 by pressing the upper die 23. Therefore, the lower surface 23A of the upper die 23 can press the center portions and the outer peripheral portions of a plurality of die pad portions 17 via the second and third metal films 15, 51. As a result, the adhesive film 11 can be pasted on the lead frame main body 12 without intervention of the clearance between the lead frame main body 12 and the adhesive film 11.

Then, in steps shown in FIG. 25, the lead frame main body 12 onto which the adhesive film 11 is pasted is stripped off the lower die 22 and the upper die 23 shown in FIG. 24. Accordingly, the lead frame 50 having the adhesive film 11, the lead frame main body 12, and the first to third metal films 13, 15, 51 is manufactured.

According to the method of manufacturing the lead frame according to the present embodiment, the second metal film 15 whose thickness is substantially equal to a thickness of the first metal film 13 is provided to the chip mounting area A of a plurality of die pad portions 17 respectively, and also the third metal film 51 whose thickness is set substantially equal to a thickness of the first metal film 13 is provided to a portion of the chip mounting surface 17A positioned on the outer side than the chip mounting area A of a plurality of die pad portions 17 respectively, and then the adhesive film 11 placed on the lower die 22 is pasted on the lower surface of the lead frame main body 12 by pressing the upper die 23. Therefore, the lower surface 23A of the upper die 23 can press the center portions and the outer peripheral portions of a plurality of die pad portions 17 via the second and third metal films 15, 51. As a result, the adhesive film 11 can be pasted on the lead frame main body 12 without intervention of the clearance between the lead frame main body 12 and the adhesive film 11.

Fourth Embodiment

Figure 26:
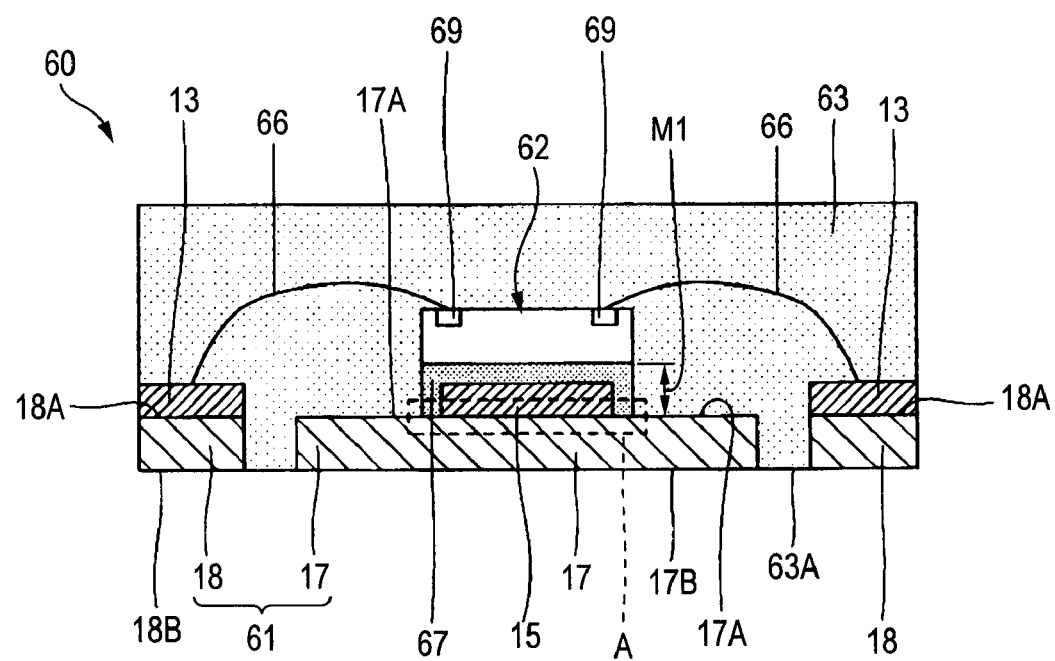
FIG. 26 is a sectional view of a semiconductor device according to a fourth embodiment of the present invention.
Figure 27:
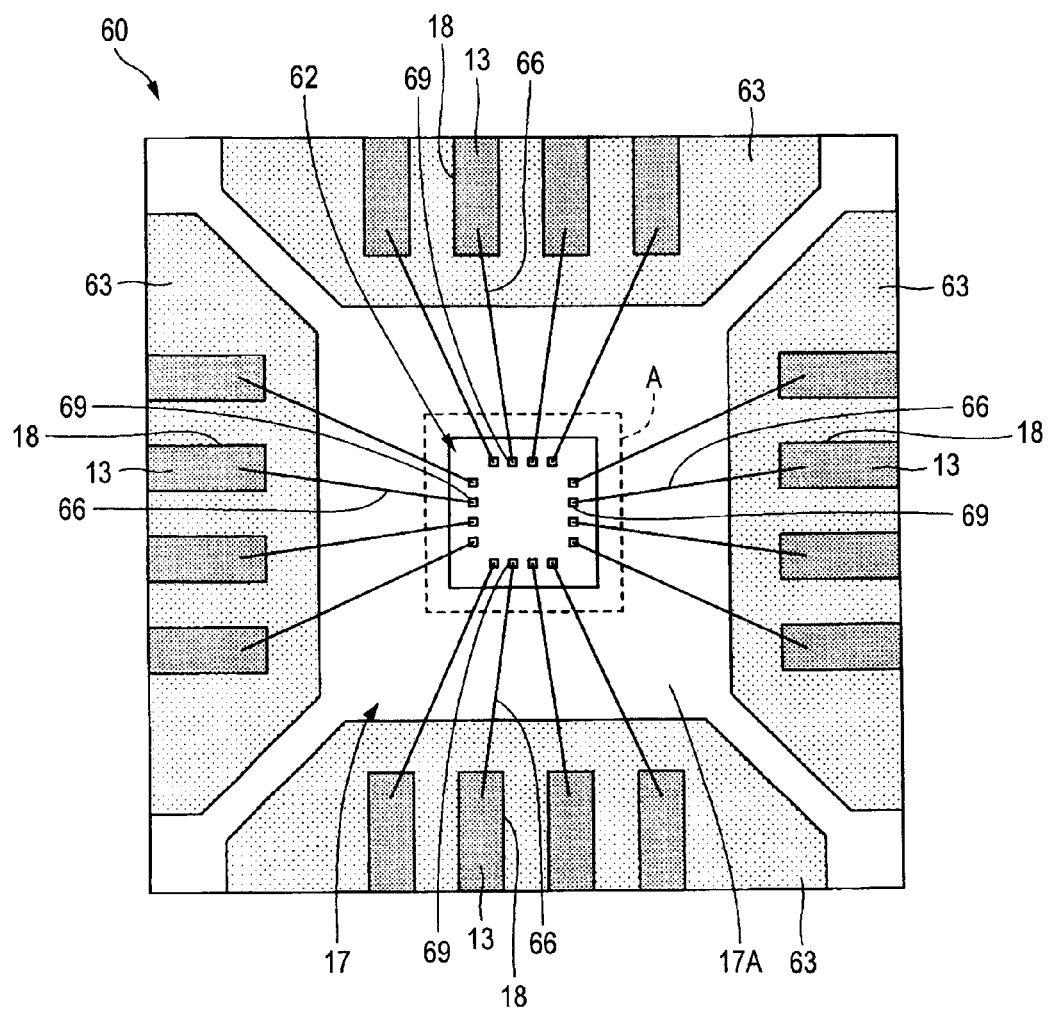
FIG. 27 is a plan view of the semiconductor device shown in FIG. 26.

FIG. 26 is a sectional view of a semiconductor device according to a fourth embodiment of the present invention. FIG. 27 is a plan view of the semiconductor device shown in FIG. 26. In FIG. 26 and FIG. 27, the same reference symbols are affixed to the same configurative portions as those of the lead frame 10 of the first embodiment explained as above. Also, in FIG. 27, for convenience of explanation, illustration of the sealing resin 63 provided on the lead frame main body 61 is omitted.

By reference to FIG. 26, a semiconductor device 60 of the fourth embodiment has a lead frame main body 61, the first metal films 13, the second metal film 15, a semiconductor chip 62, and a sealing resin 63. The semiconductor device 60 is manufactured by connecting the semiconductor chip 62 to the chip mounting areas A of a plurality of die pad portions 17 being provided to the lead frame 10, explained in the first embodiment, by the wire bonding respectively, then providing the sealing resin 63 on the lead frame main body 12 to seal the semiconductor chip 62, and then cutting the lead frame main body 12.

By reference to FIG. 26 and FIG. 27, the lead frame main body 61 has the die pad portion 17 having the chip mounting area A on which the semiconductor chip 62 is mounted, and a plurality of lead portions 18 arranged to surround the die pad portion 17. A plurality of lead portions 18 are arranged in positions that are away from the die pad portion 17. A plurality of lead portions 18 function as the external connection terminals of the semiconductor device 60. As the material of the lead frame main body 61 constructed as above, for example, Cu can be used. Also, a thickness of the lead frame main body 61 can be set to 0.2 mm, for example.

The first metal film 13 is provided to the upper surfaces 18A of a plurality of lead portions 18 respectively. The first metal films 13 are connected electrically to the semiconductor chip 62 via a metal wire 66 respectively. As the first metal film 13, for example, an Ag film can be used. A thickness of the first metal film 13 can be set to 2 μm to 6 μm, for example.

The second metal film 15 is provided on the chip mounting area A of the die pad portion 17. A thickness of the second metal film 15 is formed substantially equal to a thickness of the first metal film 13. As the second metal film 15, for example, an Ag film can be used.

In this manner, the second metal film 15 whose thickness is substantially equal to a thickness of the first metal film 13 is provided in the chip mounting area A of the die pad portion 17. Therefore, for example, when the semiconductor device 60 is manufactured by using the lead frame 10 explained in the first embodiment, no clearance is produced between the lead frame main body 12 and the adhesive film 11, so that the semiconductor chip 62 can be adhered to the die pad portion 17 not to tilt with respect to the chip mounting surface 17A. As a result, the metal wire 66 can be connected to electrode pads 69 of the semiconductor chip 62 with good precision, and thus a yield of the semiconductor device 60 can be improved.

Also, the sealing resin 63 never goes round to the lower surface 17B of the die pad portion 17. Therefore, a yield of the semiconductor device 60 can be improved.

The semiconductor chip 62 is adhered onto the chip mounting area A of the die pad portion 17, in which the second metal film 15 is formed, by an adhesive 67. A thickness M1 of the adhesive 67 is set thicker than a thickness of the second metal film 15. When a thickness of the second metal film 15 is set to 2 μm to 6 μm, a thickness M1 of the adhesive 67 can be set to 10 μm, for example.

The semiconductor chip 62 has a semiconductor substrate (not shown), a semiconductor integrated circuit (not shown) formed on the semiconductor substrate, and a plurality of electrode pads 69 connected electrically to the semiconductor integrated circuit. The electrode pad 69 is connected to the metal wire 66. The electrode pad 69 is connected electrically to the first metal film 13 via the metal wire 66.

The sealing resin 63 is provided to the lead frame main body 61 to seal the semiconductor chip 62 and the metal wires 66. A lower surface 63A of the sealing resin 63 in positions between side surfaces of the die pad portion 17 and side surfaces of plural lead portions 18 is set to constitute the substantially same plane as the lower surface 17B of the die pad portion 17 and the lower surfaces 18B of the lead portions 18.

According to the semiconductor device of the present embodiment, the second metal film 15 whose thickness is substantially equal to a thickness of the first metal film 13 is provided in the chip mounting area A of the die pad portion 17. Therefore, for example, when the semiconductor device 60 is manufactured by using the lead frame 10 explained in the first embodiment, no clearance is produced between the lead frame main body 12 and the adhesive film 11. Thus, the semiconductor chip 62 can be adhered to the die pad portion 17 without inclination to the chip mounting surface 17A. As a result, the metal wire 66 can be connected to electrode pads 69 of the semiconductor chip 62 with good precision, and thus a yield of the semiconductor device 60 can be improved.

Also, the sealing resin 63 never goes round to the lower surface 17B of the die pad portion 17. Therefore, a yield of the semiconductor device 60 can be improved.

Further, the second metal film 15 is provided in the chip mounting area A of the die pad portion 17 (for example, the center of the die pad portion 17) and the semiconductor chip 62 is provided on the second metal film 15 via the adhesive 67 so that the second metal film 15 is covered by the semiconductor chip 62 and the adhesive 67. Therefore, the adhesion of the sealing resin 63 with respect to the structural body shown in FIG. 30 becomes better than that with respect to a structure that the second metal film is exposed from the semiconductor device and the adhesive.

FIG. 28 to FIG. 33 are views showing steps of manufacturing the semiconductor device according to the fourth embodiment of the present invention. In FIG. 28 to FIG. 33, the same reference symbols are affixed to the same configurative portions as those of the semiconductor device 60 of the fourth embodiment. Also, in FIG. 28 to FIG. 33, B denotes an area in which the semiconductor device 60 is formed (referred to as a "semiconductor device forming area B" hereinafter), and C denotes an area in which the lead frame main body 12 is cut (referred to as a "cutting area C" hereinafter).

Figure 28:
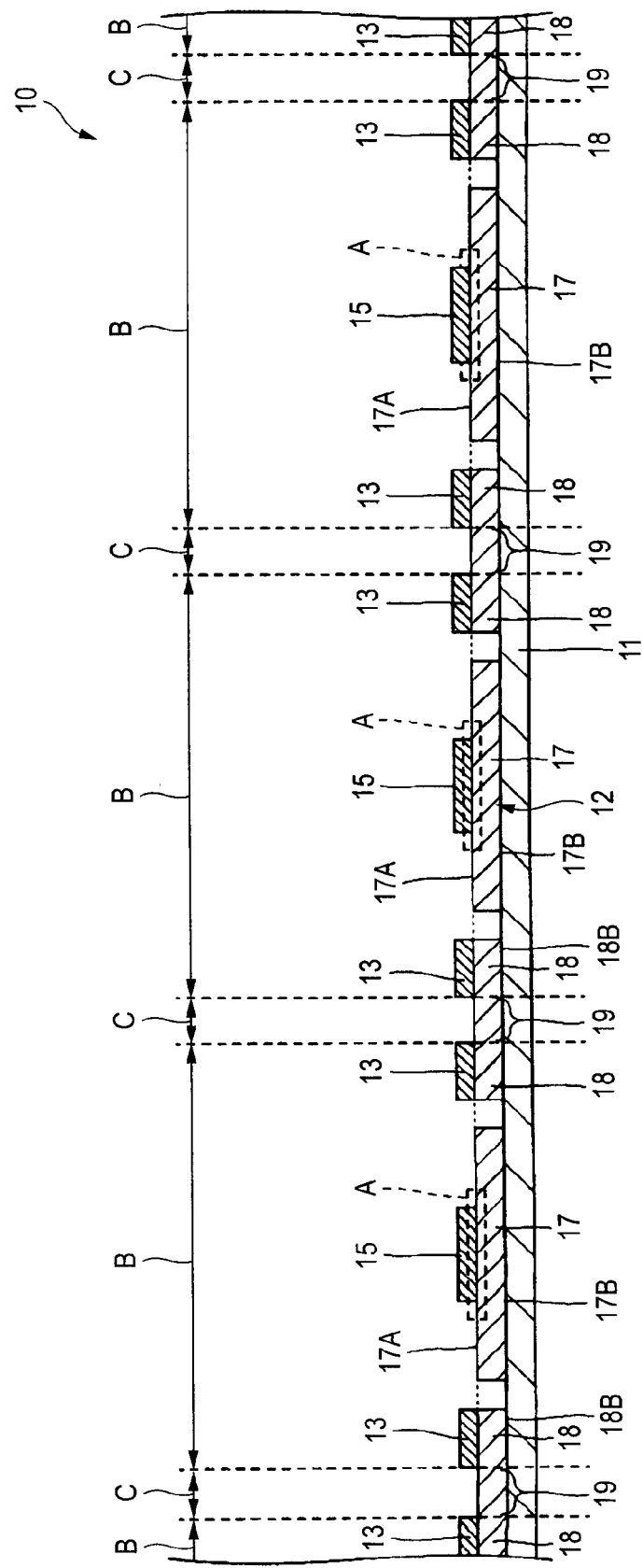
FIG. 28 is a view (#1) showing steps of manufacturing the semiconductor device according to the fourth embodiment of the present invention.

At first, in steps shown in FIG. 28, the lead frame 10 is formed by carrying out the similar processes to the steps explained in the first embodiment and shown in FIG. 15 to FIG. 18. As explained in the first embodiment, the lead frame 10 provides such a lead frame that, because the second metal film 15 whose thickness is substantially equal to a thickness of the first metal film 13 is provided in the chip mounting areas A of a plurality of die pad portions 17 respectively, the adhesive film 11 is pasted on the lead frame main body 12 without intervention of the clearance.

Figure 29:
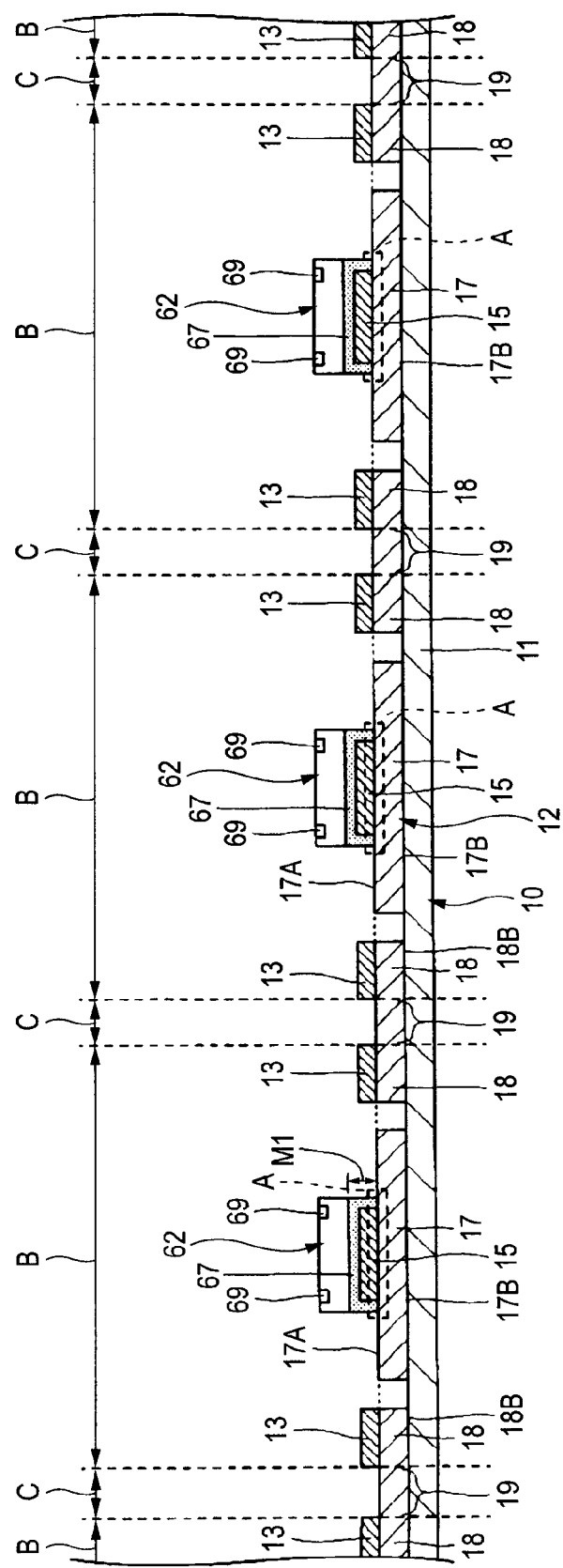
FIG. 29 is a view (#2) showing steps of manufacturing the semiconductor device according to the fourth embodiment of the present invention.

Then, in steps shown in FIG. 29, the semiconductor chip 62 is adhered to the chip mounting areas A of a plurality of die pad portions 17, in which the second metal film 15 is formed, by the adhesive 67 respectively.

In this manner, the semiconductor chip 62 can be adhered to a plurality of die pad portions 17 of the lead frame 10, in which the adhesive film 11 is pasted onto the lead frame main body 12, without intervention of the clearance. Therefore, the semiconductor chip 62 is never adhered to the die pad portion 17 in such a state that the semiconductor chip 62 is inclined to the chip mounting surface 17A. As a result, in the steps shown in FIG. 30 described later, the metal wire 66 can be connected to electrode pads 69 of the semiconductor chip 62 with good precision, and thus a yield of the semiconductor device 60 can be improved.

A thickness M1 of the adhesive 67 may be set thicker than a thickness of the second metal film 15. When a thickness of the second metal film 15 is set to 2 μm to 6 μm, a thickness M1 of the adhesive 67 can be set to 10 μm, for example.

Figure 30:
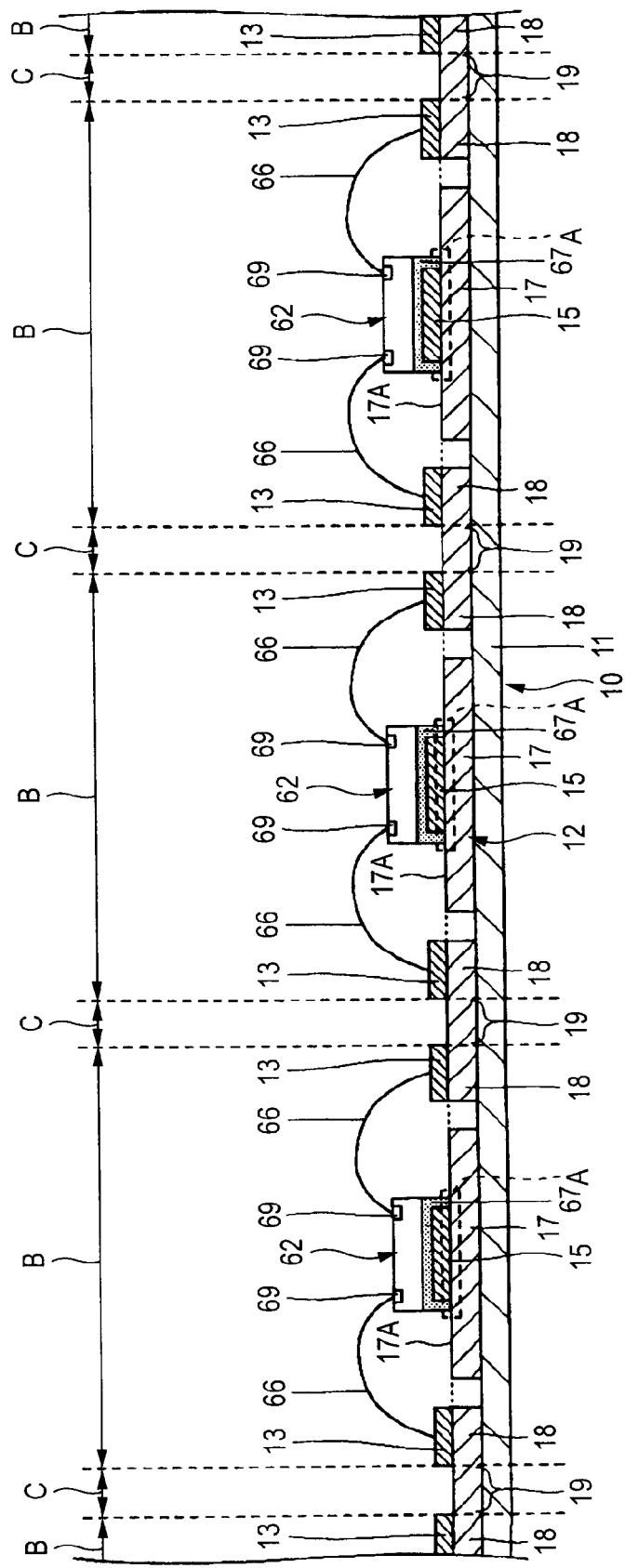
FIG. 30 is a view (#3) showing steps of manufacturing the semiconductor device according to the fourth embodiment of the present invention.

Then, in steps shown in FIG. 30, the metal wires 66 for connecting the first metal films 13 and the electrode pads 69 are formed. One end of the metal wire 66 is connected to the first metal film 13, and the other end is connected to the electrode pad 69. Accordingly, the semiconductor chip 62 can be connected to the lead frame 10 by the wire bonding.

Figure 31:
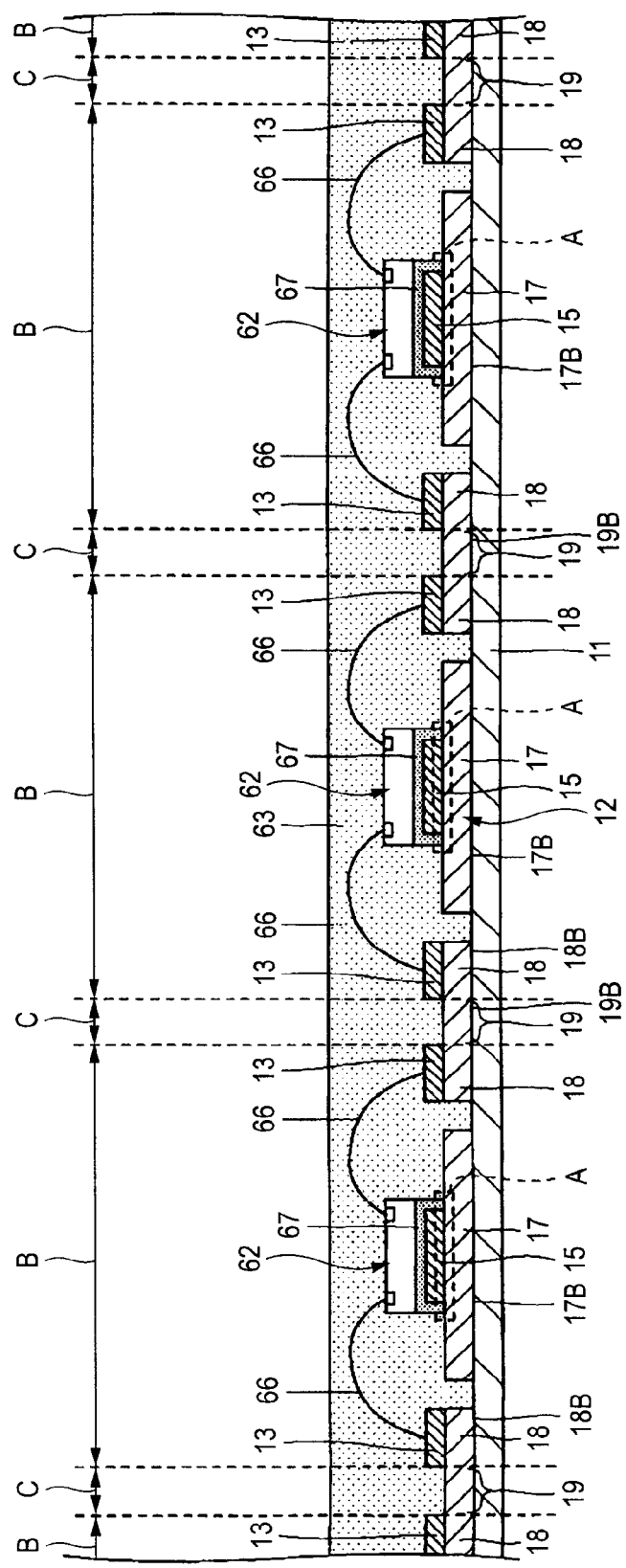
FIG. 31 is a view (#4) showing steps of manufacturing the semiconductor device according to the fourth embodiment of the present invention.

Then, in steps shown in FIG. 31, the sealing resin 63 is formed to cover the upper surface side of the structural body shown in FIG. 30. A plurality of semiconductor chips 62 and the metal wires 66 are sealed with the sealing resin 63. As a result, the structural body corresponding to the semiconductor device 60 is formed on a portion of the adhesive film 11 corresponding to the semiconductor device forming area B respectively.

Also, as explained previously, since no clearance exists between the lead frame main body 12 and the adhesive film 11, the sealing resin 63 never goes round the lower surface side of the lead frame main body 12 (in particular, the lower surface 17B side of the die pad portion 17). As a result, a yield of the semiconductor device 60 can be improved.

Figure 32:
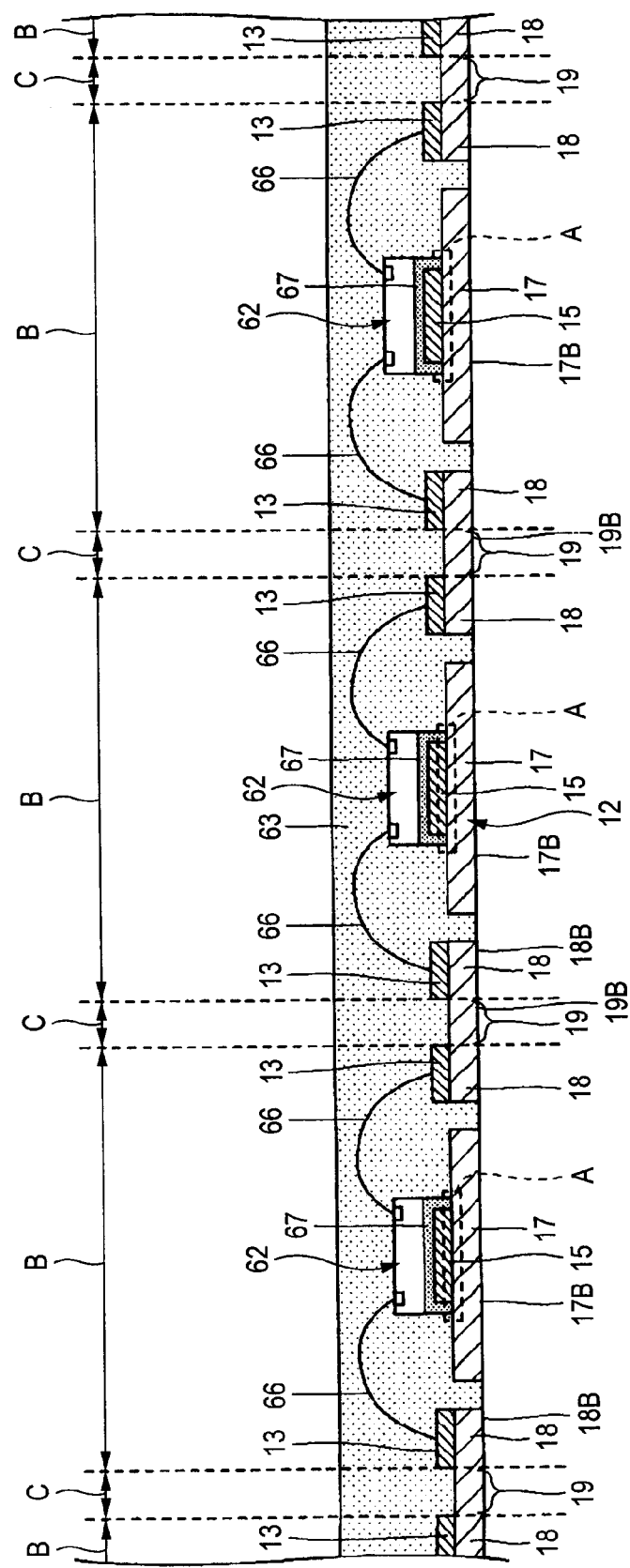
FIG. 32 is a view (#5) showing steps of manufacturing the semiconductor device according to the fourth embodiment of the present invention.
Figure 33:
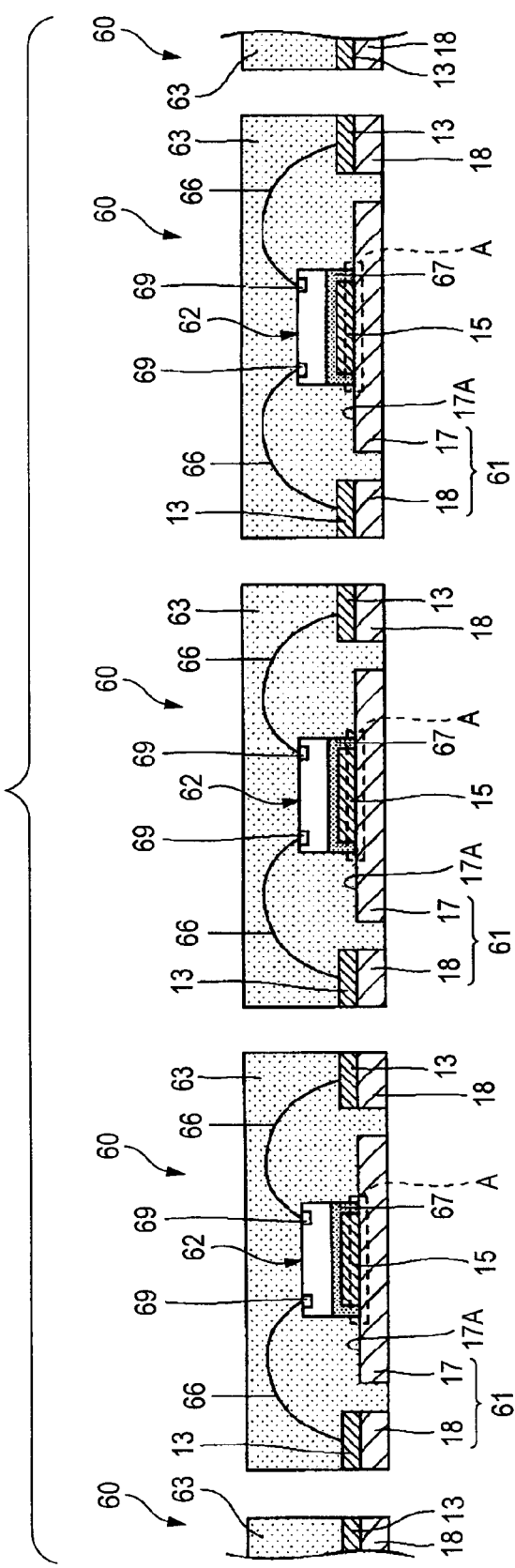
FIG. 33 is a view (#6) showing steps of manufacturing the semiconductor device according to the fourth embodiment of the present invention.

Then, in steps shown in FIG. 32, the adhesive film 11 is removed. Then, in steps shown in FIG. 33, the sealing resin 63 and the lead frame main body 12 (concretely, the frame portion 19) in the portions corresponding to the cutting areas C of the structural body shown in FIG. 32 by the dicer. Accordingly, as shown in FIG. 33, a plurality of semiconductor devices 60 are manufactured.

According to the semiconductor device manufacturing method of the present embodiment, the semiconductor chip 62 can be adhered to a plurality of die pad portions 17 of the lead frame 10, in which the adhesive film 11 is pasted onto the lead frame main body 12, without intervention of the clearance. Therefore, the semiconductor chip 62 is never adhered to the die pad portion 17 in such a state that the semiconductor chip 62 is inclined to the chip mounting surface 17A. As a result, the metal wire 66 can be connected to electrode pads 69 of the semiconductor chip 62 with good precision, and thus a yield of the semiconductor device 60 can be improved.

Also, when the sealing resin 63 is formed, the sealing resin 63 never goes round the lower surface side of the lead frame main body 12 (in particular, the lower surface 17B side of the die pad portion 17). As a result, a yield of the semiconductor device 60 can be improved.

In this case, in the present embodiment, the case where the semiconductor device 60 is formed by using the lead frame 10 in the first embodiment is explained by way of example. But the semiconductor device may be manufactured by using the lead frame 30 in the second embodiment or the lead frame 40 in the variation of the second embodiment. In this case, the similar advantages to the manufacturing method of the semiconductor device 60 of the present embodiment can be achieved.

Fifth Embodiment

Figure 34:
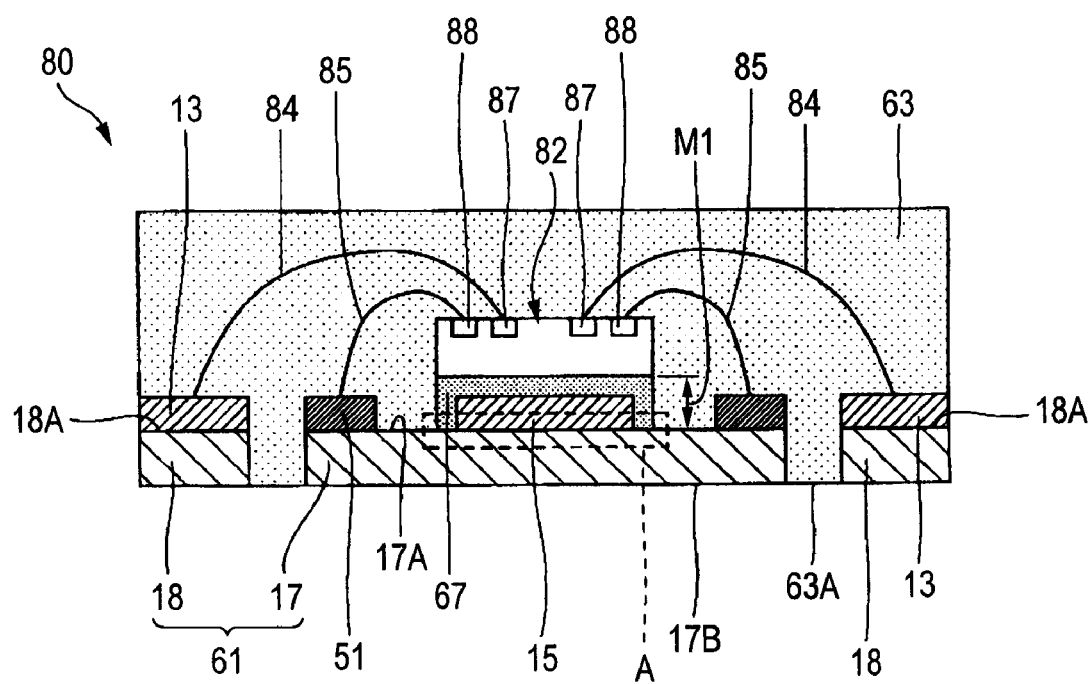
FIG. 34 is a sectional view of a semiconductor device according to a fifth embodiment of the present invention.
Figure 35:
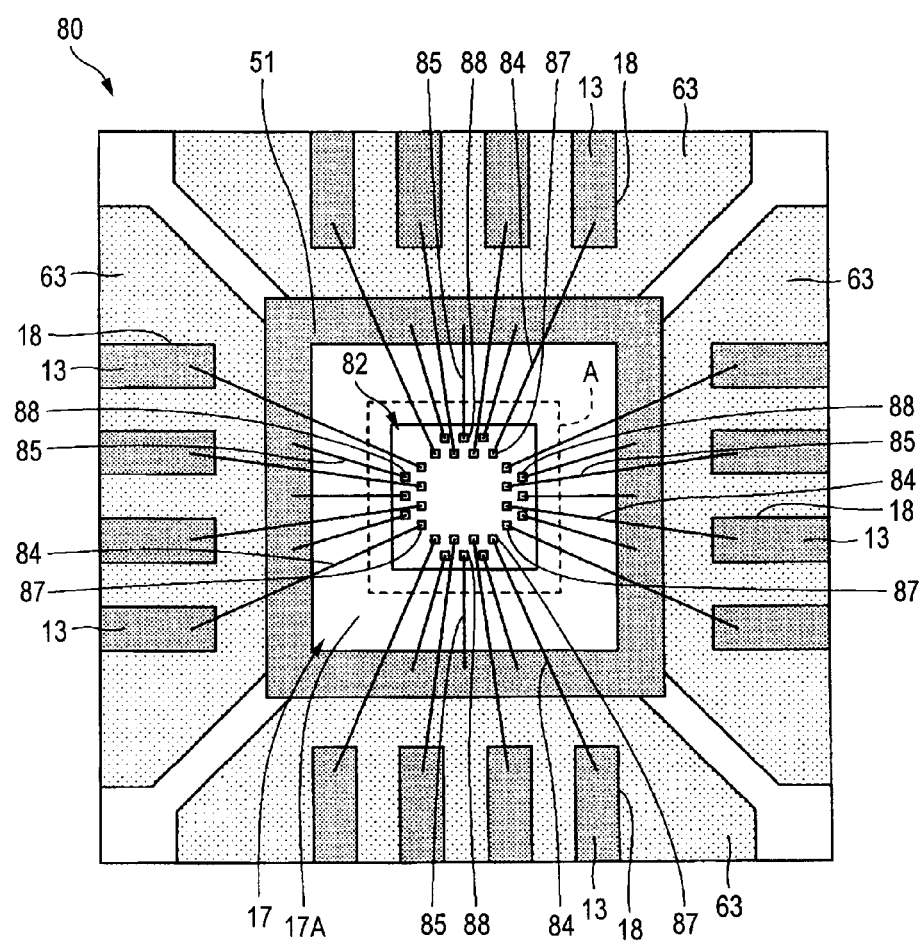
FIG. 35 is a plan view of the semiconductor device shown in FIG. 34.

FIG. 34 is a sectional view of a semiconductor device according to a fifth embodiment of the present invention. FIG. 35 is a plan view of the semiconductor device shown in FIG. 34. In FIG. 34 and FIG. 35, the same reference symbols are affixed to the same configurative portions as those of the semiconductor device 60 of the fourth embodiment. Also, in FIG. 35, for convenience of explanation, illustration of the sealing resin 63 provided on the lead frame main body 61 is omitted herein.

By reference to FIG. 34 and FIG. 35, a semiconductor device 80 of the fifth embodiment is constructed similarly to the semiconductor device 60, except that a semiconductor chip 82, first metal wires 84, and second metal wires 85 are provided instead of the semiconductor chip 62 and the metal wires 66 provided to the semiconductor device 60 in the fourth embodiment and that the third metal film 51 is provided respectively.

The semiconductor device 80 of the present embodiment is manufactured by putting the semiconductor chip 82 on the chip mounting areas A of a plurality of die pads 17 provided to the lead frame 50 explained in the third embodiment respectively, then connecting the semiconductor chip 82 to the first and third metal films 13, 51 by the wire bonding, then providing the sealing resin 63 on the lead frame 50 to seal the semiconductor chip 82, and then cutting the lead frame main body 12.

The first metal film 13 is connected to the first metal wire 84. The first metal films 13 are connected electrically to the semiconductor chip 82 via the first metal wires 84.

The third metal film 51 is provided to a portion of the chip mounting surface 17A positioned on the outer side of the chip mounting area A of the die pad portion 17 respectively. A thickness of the third metal film 51 is set substantially equal to a thickness of the first metal film 13. The third metal films 51 are connected the second wires 85. The third metal films 51 are connected electrically to the semiconductor chip 82 via the metal wire 85 respectively. As the third metal film 51, for example, an Ag film can be used. A thickness of the third metal film 51 can be set to 2 µm to 6 µm, for example.

The semiconductor chip 82 is adhered onto the chip mounting area A of the die pad portion 17, in which the second metal film 15 is formed, by the adhesive 67. A thickness M1 of the adhesive 67 is set thicker than a thickness of the second metal film 15. When a thickness of the second metal film 15 is set to 2 µm to 6 µm, a thickness M1 of the adhesive 67 can be set to 10 µm, for example.

The semiconductor chip 82 has a semiconductor substrate (not shown), a semiconductor integrated circuit (not shown) formed on the semiconductor substrate, and a plurality of first and second electrode pads 87, 88 connected electrically to the semiconductor integrated circuit. The first electrode pad 87 is connected to the first metal film 13 via the first metal wire 84. One end portion of the first metal wire 84 is connected to the first metal film 13, while the other end is connected to the first electrode pad 87.

The second electrode pads 88 are connected to the third metal film 51 via the second metal wires 85. One end portion of the second metal wire 85 is connected to the third metal film 51, while the other end portion is connected to the second electrode pad 88.

The semiconductor chip 82, the first metal wires 84, and the second metal wires 85 are sealed with the sealing resin 63.

The semiconductor device 80 of the fifth embodiment constructed in such manner can obtain the similar advantages to the semiconductor device 60 of the fourth embodiment.

FIG. 36 to FIG. 41 are views showing steps of manufacturing the semiconductor device according to the fifth embodiment of the present invention. In FIG. 36 to FIG. 41, the same reference symbols are affixed to the same configurative portions as those of the semiconductor device 80 of the fifth embodiment. Also, in FIG. 36 to FIG. 40, C denotes an area in which the lead frame main body 12 is cut (referred to as a "cutting area C" hereinafter), and D denotes in which the semiconductor device 80 is formed (referred to as a "semiconductor device forming area D" hereinafter).

Figure 36:
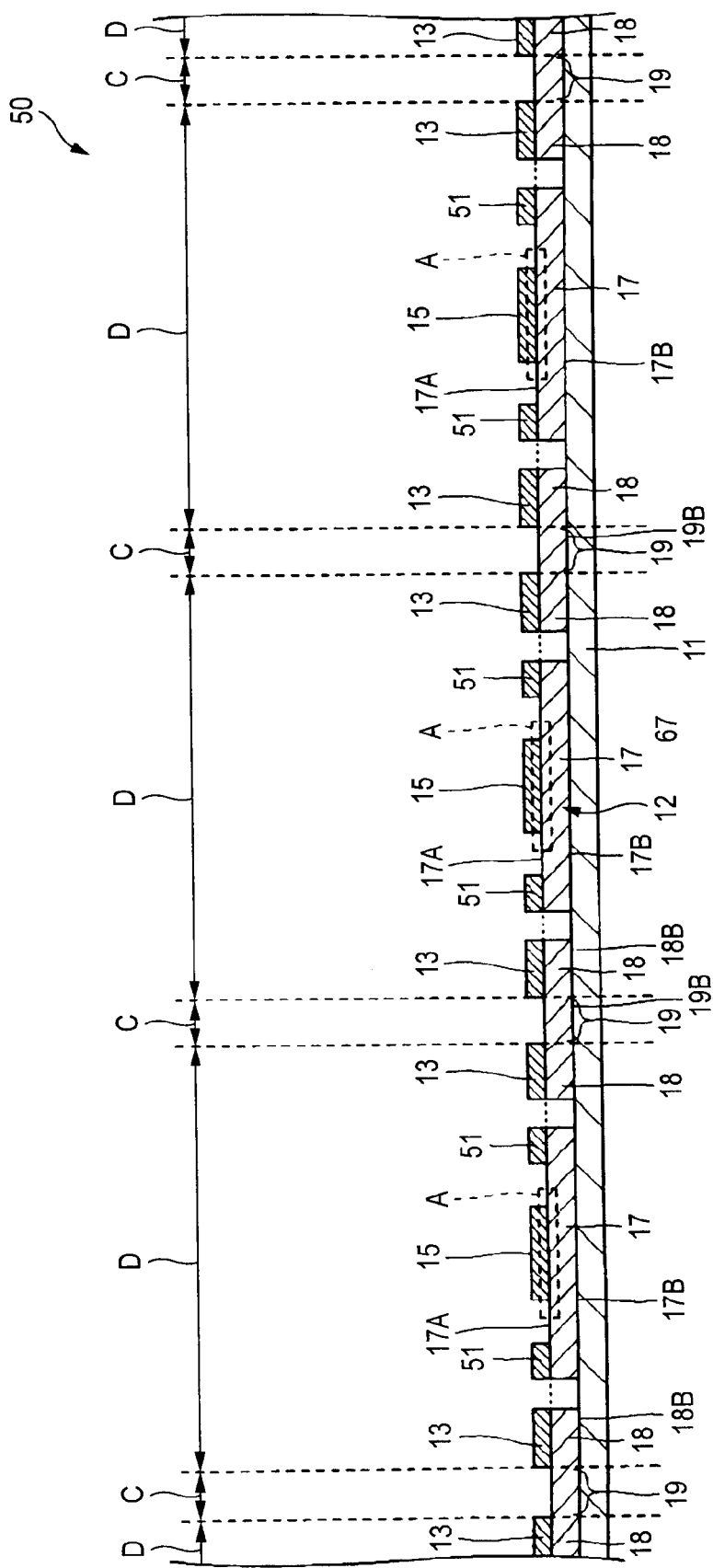
FIG. 36 is a view (#1) showing steps of manufacturing the semiconductor device according to the fifth embodiment of the present invention.

At first, in steps shown in FIG. 36, the lead frame 50 is formed by executing the similar processes to the steps explained in the third embodiment and shown in FIG. 23 to FIG. 25. As explained in the third embodiment, the lead frame 50 provides such a lead frame that the second metal film 15 whose thickness is substantially equal to a thickness of the first metal film 13 is provided to the chip mounting area A of a plurality of die pad portions 17 respectively, and also the third metal film 51 is provided to a portion of the chip mounting surface 17A positioned on the outer side than the chip mounting area A of a plurality of die pad portions 17 respectively, whereby the adhesive film 11 is pasted on the lead frame main body 12 without intervention of the clearance.

Figure 37:
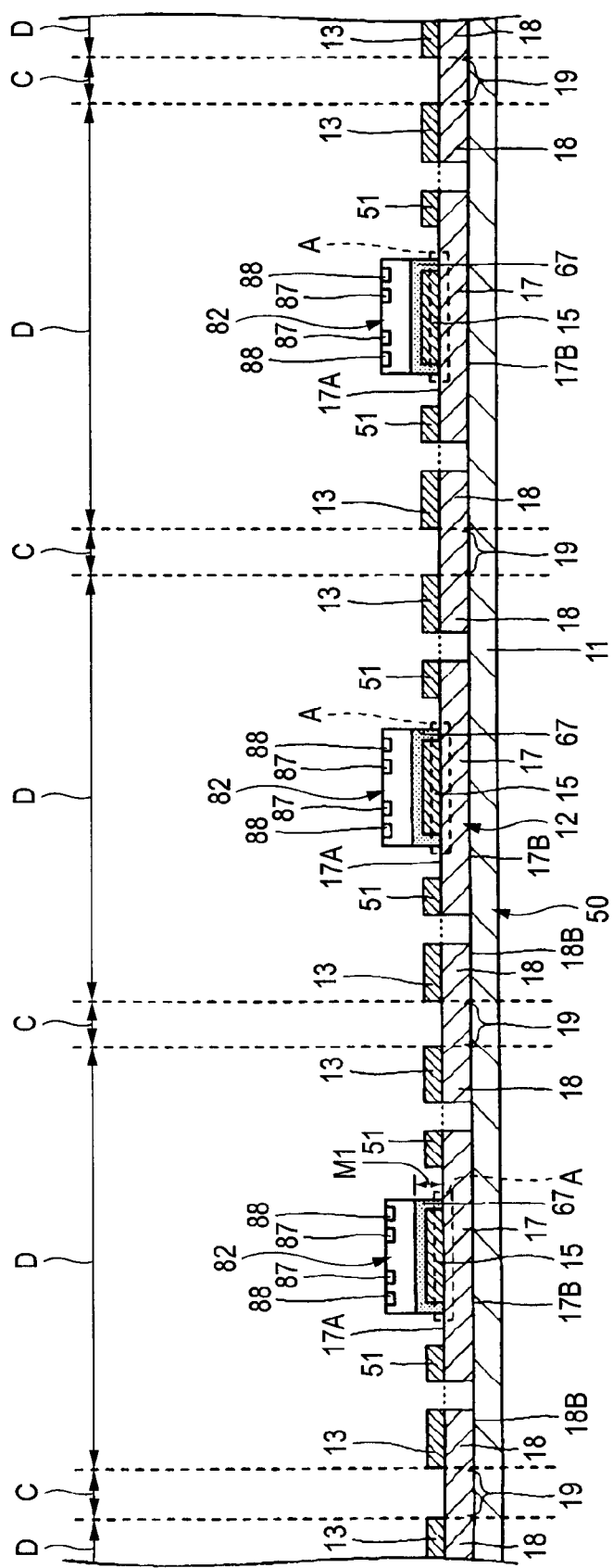
FIG. 37 is a view (#2) showing steps of manufacturing the semiconductor device according to the fifth embodiment of the present invention.

Then, in steps shown in FIG. 37, the semiconductor chip 82 is adhered to the chip mounting areas A of a plurality of die pad portions 17, in which the second metal film 15 is formed, by the adhesive 67 respectively In this manner, the semiconductor chip 82 is adhered to the die pad portions 17 of the lead frame 50, in which the adhesive film 11 is adhered to the lead frame main body 12, respectively without intervention of the clearance. Therefore, such a situation can be eliminated that the semiconductor chip 82 is adhered to the chip mounting surface 17A in its tilted state. As a result, in steps shown in FIG. 38, the first and second metal wires 84, 85 can be connected to the first and second electrode pads 87, 88 of the semiconductor chip 82 with good precision respectively, and thus a yield of the semiconductor device 80 can be improved.

A thickness M1 of the adhesive 67 is formed thicker than a thickness of the second metal film 15. When a thickness of the second metal film 15 is set to 2 μm to 6 μm, a thickness M1 of the adhesive 67 can be set to 10 μm, for example.

Figure 38:
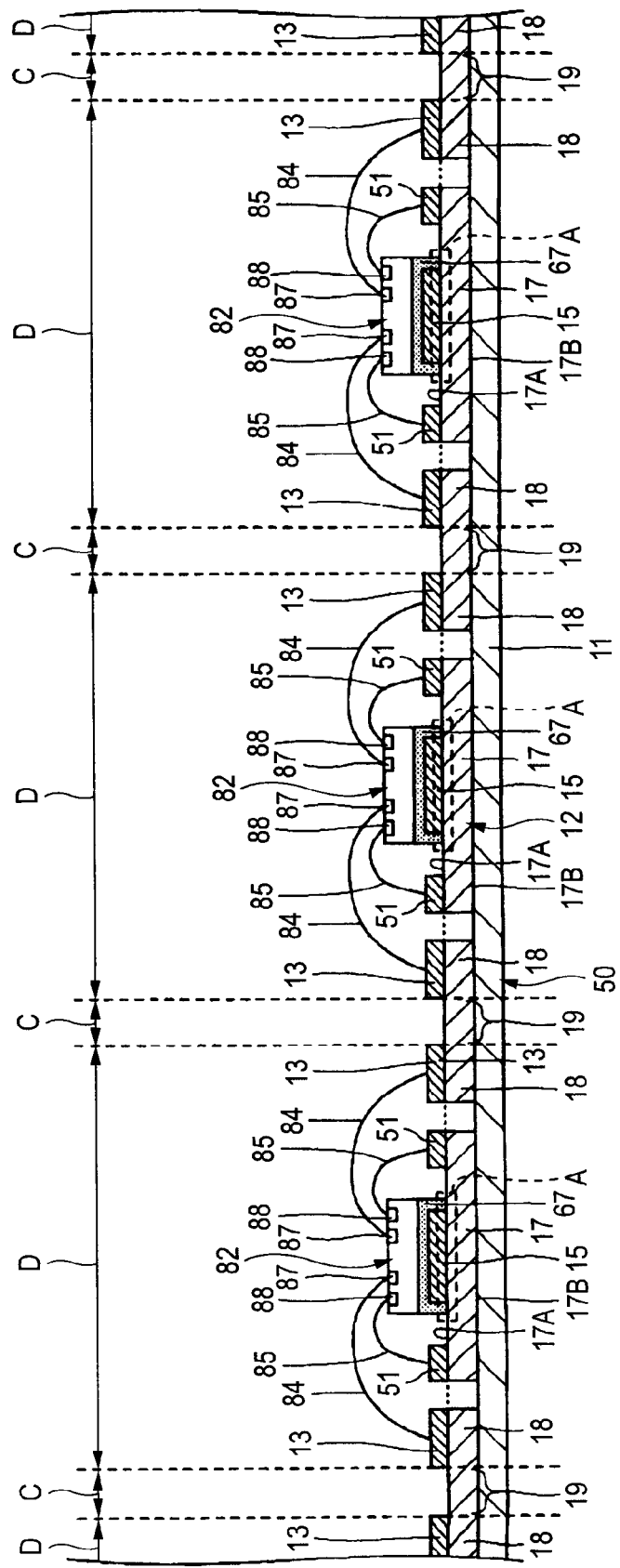
FIG. 38 is a view (#3) showing steps of manufacturing the semiconductor device according to the fifth embodiment of the present invention.

Then, in steps shown in FIG. 38, the first metal wires 84 for connecting the first metal films 13 and the first electrode pads 87 and the second metal wires 85 for connecting the third metal films 51 and the second electrode pads 88 are formed. One end of the first metal wire 84 is connected to the first metal film 13, and the other end is connected to the first electrode pad 87. Also, one end of the second metal wire 85 is connected to the third metal film 51, and the other end is connected to the second electrode pad 88. Accordingly, the semiconductor chip 82 can be connected to the lead frame 50 by the wire bonding.

Figure 39:
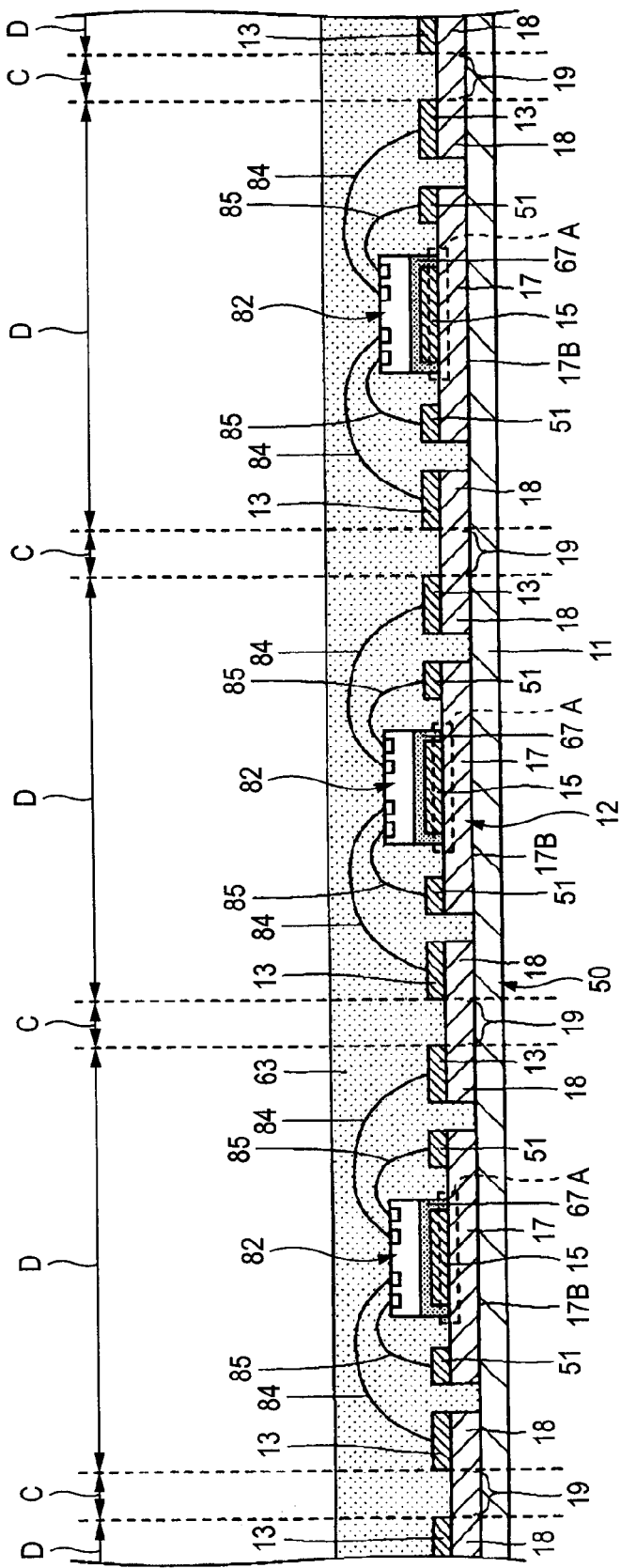
FIG. 39 is a view (#4) showing steps of manufacturing the semiconductor device according to the fifth embodiment of the present invention.

Then, in steps shown in FIG. 39, the sealing resin 63 is formed to cover the upper surface side of the structural body shown in FIG. 38. A plurality of semiconductor chips 82, the first metal wires 84, and the second metal wires 85 are sealed with the sealing resin 63. As a result, the structural body corresponding to the semiconductor device 80 is formed on a portion of the adhesive film 11 corresponding to the semiconductor device forming area D respectively.

Also, as explained previously, since no clearance exists between the lead frame main body 12 and the adhesive film 11, the sealing resin 63 never goes round the lower surface side of the lead frame main body 12 (in particular, the lower surface 17B side of the die pad portion 17). As a result, a yield of the semiconductor device 80 can be improved.

Figure 40:
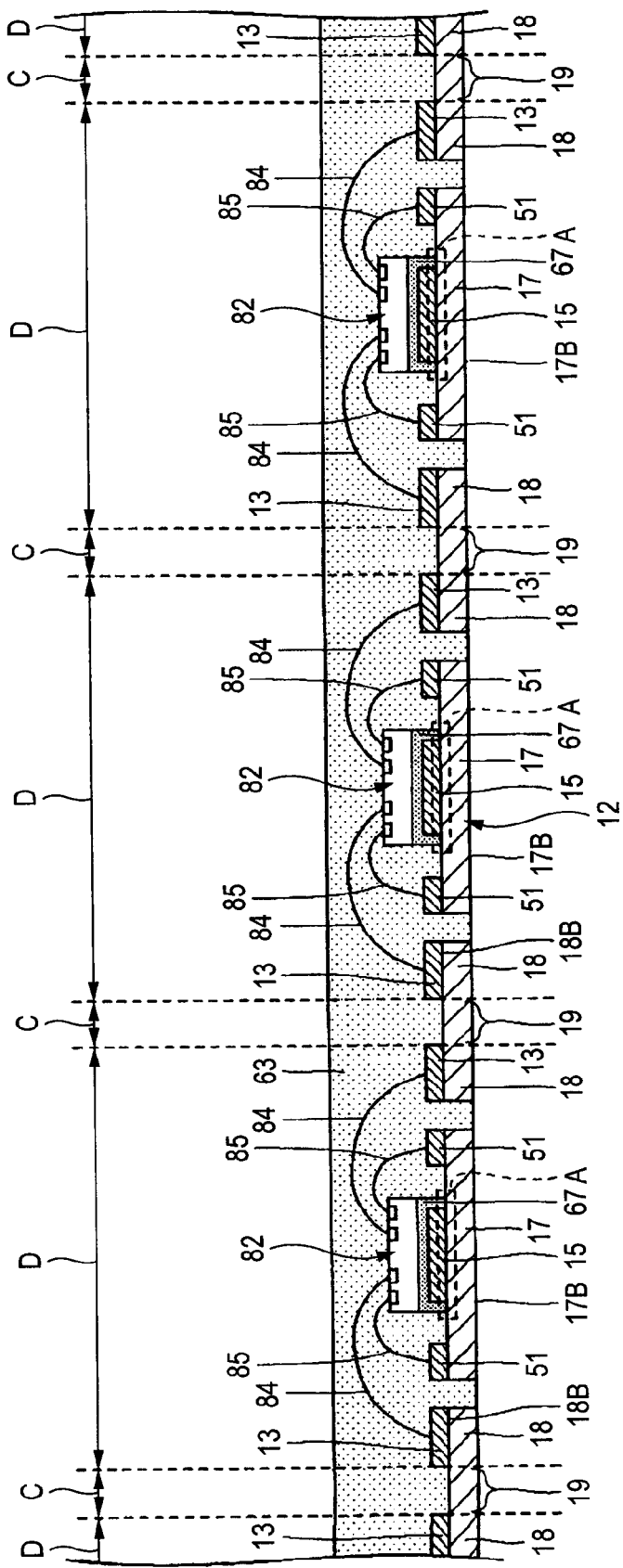
FIG. 40 is a view (#5) showing steps of manufacturing the semiconductor device according to the fifth embodiment of the present invention.
Figure 41:
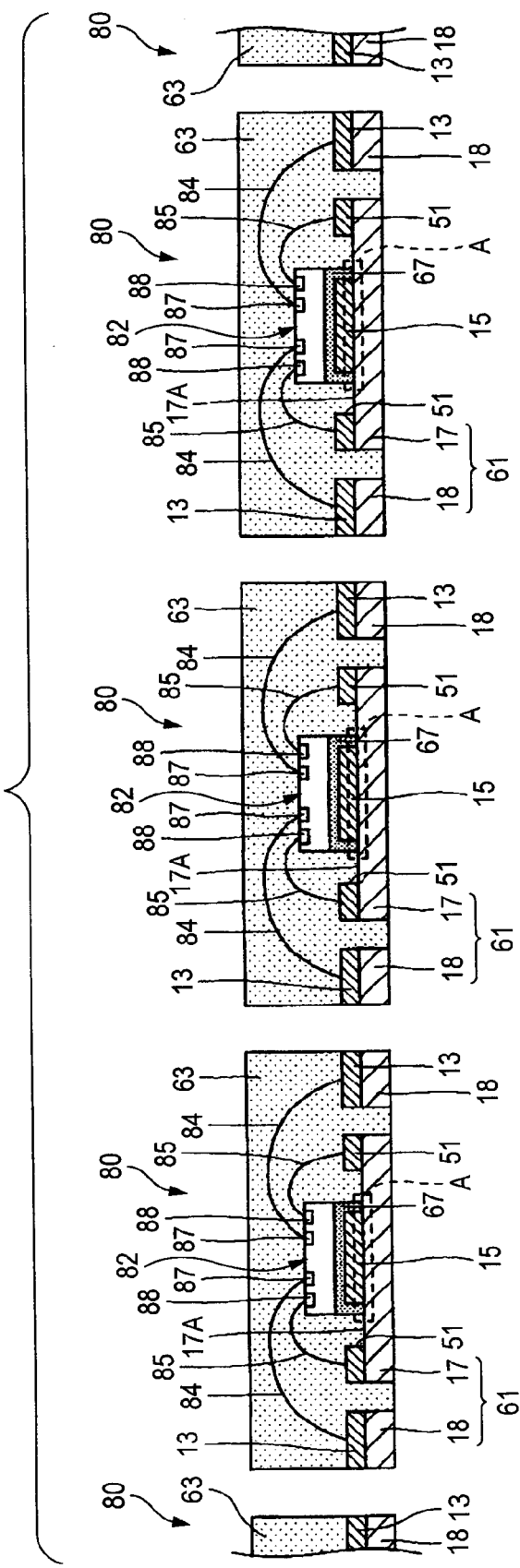
FIG. 41 is a view (#6) showing steps of manufacturing the semiconductor device according to the fifth embodiment of the present invention.

Then, in steps shown in FIG. 40, the adhesive film 11 is removed. Then, in steps shown in FIG. 41, the sealing resin 63 and the lead frame main body 12 (concretely, the frame portion 19) in the portions corresponding to the cutting areas C of the structural body shown in FIG. 40 by the dicer. Accordingly, as shown in FIG. 41, a plurality of semiconductor devices 80 are manufactured.

According to the semiconductor device manufacturing method of the present embodiment, the semiconductor chip 82 can be adhered to a plurality of die pad portions 17 of the lead frame 50, in which the adhesive film 11 is pasted onto the lead frame main body 12, without intervention of the clearance. Therefore, the semiconductor chip 82 is never adhered to the die pad portion 17 in such a state that the semiconductor chip 82 is inclined to the chip mounting surface 17A. As a result, the first and second metal wires 84, 85 can be connected to the first and second electrode pads 87, 88 of the semiconductor chip 82 respectively with good precision, and thus a yield of the semiconductor device 80 can be improved.

Also, when the sealing resin 63 is formed, the sealing resin 63 never goes round the lower surface side of the lead frame main body 12 (in particular, the lower surface 17B side of the die pad portion 17). As a result, a yield of the semiconductor device 80 can be improved.

With the above, preferred embodiments of the present invention are described in detail, but the present invention is not limited to such particular embodiments. Various variations and modifications can be applied within a scope of a gist of the present invention set forth in claims.

The present invention can be applied to the lead frame having the adhesive film to prevent such a situation that the sealing resin goes round to the lower surface side of the lead frame main body and the method of manufacturing the same, and the semiconductor device manufactured by using the lead frame.

What is claimed is:

1. A method of manufacturing a lead frame including a lead frame main body having a die pad portion having a chip mounting surface on which a semiconductor chip is mounted, a plurality of lead portions arranged to surround the die pad portion, and a frame portion for supporting the die pad portion and the lead portions, said die pad portion having a first surface and a second surface, said lead portions having first surfaces and second surface, and said frame portion having a first surface and a second surface, wherein said first surfaces of said die pad portion, said lead portions, and said frame portion face in a first direction and wherein said second surface of said die pad portion, said lead portions, and said frame portion face in a second direction, said first direction being opposite to said second direction, wherein a first surface of the lead frame main body includes the first surfaces of the die pad portion, the lead portions, and the frame portion, and wherein said chip mounting surface is on the first surface of said die pad portion, and an adhesive film provided on a second surface of the lead frame main body, which opposes the first surface of the die pad portion to which the semiconductor chip is mounted, said method comprising:

a first metal film forming step of forming a first metal film on the first surfaces of the lead portions, which oppose the second surface of the lead frame main body to which the adhesive film is provided;

a second metal film forming step of forming a second metal film, whose thickness is substantially equal to a thickness of the first metal film, on the chip mounting surface of the die pad portion; and an adhesive film providing step of providing the adhesive film on the second surface of the lead frame main body by pressing after the first metal film and the second metal film are formed.

2. A method of manufacturing a lead frame according to claim 1, wherein the first metal film and the second metal film are formed simultaneously.

3. A method of manufacturing a lead frame according to claim 1, further comprising:

a third metal film forming step of forming a third metal film, whose thickness is substantially equal to a thickness of the first metal film, positioned on a portion of the chip mounting surface of the die pad portion that is spaced from the second metal film along the chip mounting surface.

4. A method of manufacturing a lead frame according to claim 3, wherein the first metal film, the second metal film, and the third metal film are formed simultaneously.

5. A method of manufacturing a lead frame according to claim 1, further comprising:

a lead frame main body forming step of forming the lead frame main body by working a plate such that the die pad portion, the lead portions, and the frame portion are monolithic to each other.

* * * * *